(12) United States Patent
Sakata et al.

(10) Patent No.: US 9,423,680 B2
(45) Date of Patent: Aug. 23, 2016

(54) LIGHT SOURCE APPARATUS THAT IRRADIATES A PHOSPHOR LAYER WITH EXCITATION LIGHT AND PROJECTOR

(71) Applicant: SEIKO EPSON CORPORATION, Tokyo (JP)

(72) Inventors: Hidefumi Sakata, Tatsuno-machi (JP); Toshiaki Hashizume, Okaya (JP); Wataru Yasumatsu, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 180 days.

(21) Appl. No.: 14/335,223

(22) Filed: Jul. 18, 2014

(65) Prior Publication Data

US 2015/0029466 A1  Jan. 29, 2015

(30) Foreign Application Priority Data

Jul. 23, 2013  (JP) ................. 2013-152320
Dec. 20, 2013  (JP) ................. 2013-263727
Apr. 23, 2014  (JP) ................. 2014-089596

(51) Int. Cl.
*G03B 21/00* (2006.01)
*G03B 21/20* (2006.01)
*H01S 5/10* (2006.01)
*H04N 9/31* (2006.01)
*H01L 33/44* (2010.01)
*H01L 33/50* (2010.01)
*F21Y 101/02* (2006.01)
*H01L 33/54* (2010.01)

(52) U.S. Cl.
CPC ........... *G03B 21/208* (2013.01); *G03B 21/204* (2013.01); *H01L 33/44* (2013.01); *H01L 33/507* (2013.01); *H01S 5/1092* (2013.01); *H04N 9/3158* (2013.01); *F21Y 2101/02* (2013.01); *F21Y 2101/025* (2013.01); *H01L 33/54* (2013.01)

(58) Field of Classification Search
CPC ..... G03B 21/00; H01L 33/44; H01L 33/507; H01L 33/54; H01S 5/1092; H04N 9/3158; F21Y 2101/02; F21Y 2101/025
See application file for complete search history.

(56) References Cited

U.S. PATENT DOCUMENTS

| | | | |
|---|---|---|---|
| 2007/0182299 A1* | 8/2007 | Ouderkirk | H01L 33/507 313/110 |
| 2013/0135593 A1* | 5/2013 | Saitou | G03B 21/204 353/31 |
| 2015/0228868 A1* | 8/2015 | Ouderkirck | H01L 25/0753 362/84 |

FOREIGN PATENT DOCUMENTS

| | | |
|---|---|---|
| JP | A-2009-150938 | 7/2009 |
| JP | A-2010-86815 | 4/2010 |
| JP | A-2011-128482 | 6/2011 |

*Primary Examiner* — Sultan Chowdhury
*Assistant Examiner* — Magda Cruz
(74) *Attorney, Agent, or Firm* — Oliff PLC

(57) ABSTRACT

A light source apparatus includes a light emitting device that has a first light emitting region outputting first excitation light and a second light emitting region outputting second excitation light, a phosphor layer that is so provided that the phosphor layer coincides with the first light emitting region in a plan view and emits fluorescence light, a reflector that is provided on the opposite side of the phosphor layer to the light emitting device, transmits the fluorescence light, and reflects the excitation light, and a light guide section that is disposed on an optical path between the phosphor layer and the reflector, and guides the second excitation light reflected off the reflector such that at least part of the reflected second excitation light enters the phosphor layer.

20 Claims, 15 Drawing Sheets

LIGHT SOURCE APPARATUS THAT IRRADIATES A PHOSPHOR LAYER WITH EXCITATION LIGHT AND PROJECTOR

BACKGROUND

1. Technical Field

The present invention relates to a light source apparatus and a projector.

2. Related Art

There is a known light source apparatus that irradiates a phosphor layer with excitation light outputted from a laser or any other light source and uses light emitted from the phosphor layer to form illumination light. The light source apparatus is used in a projector including a light modulator, and a technology that meets a need for high luminance has been proposed (see JP-A-2011-128482, for example).

The light source apparatus described in JP-A-2011-128482 includes a first light source apparatus having a first light source that outputs primary excitation light and a phosphor layer that converts the primary excitation light into fluorescence and outputs the fluorescence, a second light source apparatus having a second light source that outputs secondary excitation light, and an excitation light reflection mirror that is disposed on the optical path of the first light source apparatus and has an excitation light reflecting portion and an excitation light transmitting portion. The secondary excitation light passes through the excitation light transmitting portion and impinges on the phosphor layer from the side opposite to the side on which the primary excitation light impinges, and the phosphor layer also converts the secondary excitation light into fluorescence and outputs the fluorescence.

The light source apparatus of the related art described above, however, requires not only the first light source apparatus that outputs primary excitation light but also the second light source that outputs secondary excitation light. Since the light source apparatus of the related art further includes a lens which guides the second excitation light and the excitation light reflection mirror, the number of parts and the size of the entire apparatus undesirably increase. Further, since part of the excitation light reflection mirror, which needs to transmit the secondary excitation light, forms an excitation light transmitting region, part of the excitation light from the first light source is not undesirably used in an effective manner.

SUMMARY

An advantage of some aspects of the invention is to provide a light source apparatus that allows effective use of excitation light in a simple configuration, and also to provide a projector.

A first aspect of the invention provides a light source apparatus including a light emitting device that has a first light emitting region and a second light emitting region and outputs excitation light of a first wavelength band, a phosphor layer that is so provided that the phosphor layer coincides with the first light emitting region in a plan view and emits light of a second wavelength band different from the first wavelength band when irradiated with first excitation light outputted from the first light emitting region, a reflection element that is provided on the opposite side of the phosphor layer to the light emitting device, transmits light of the second wavelength band, and reflects light of the first wavelength band, and a light guide section that is disposed on an optical path between the phosphor layer and the reflection element, transmits second excitation light outputted from the second light emitting region and light outputted from the phosphor layer, and guides the second excitation light reflected off the reflection element in such a way that at least part of the reflected second excitation light is incident on the phosphor layer.

According to the configuration of the light source apparatus according to the first aspect, the first excitation light outputted from the first light emitting region of the light source enters the phosphor layer, and at least part of the second excitation light outputted from the second light emitting region of the light source is reflected off the reflection element, passes through the light guide section, and enters the phosphor layer. That is, both sides of the phosphor layer are irradiated with the excitation light from the side facing the light source and the side facing away from the light source. Both sides of the phosphor layer can therefore be irradiated with the excitation light without employing a complicated structure that allows the phosphor layer to be irradiated with the excitation light from the side facing away from the light source. The light source apparatus can therefore be so provided that it efficiently outputs light of the second wavelength band. Further, increase in the number of parts can be suppressed. Moreover, as compared with a configuration in which the phosphor layer is provided over the entire light emitting region of the light source, light of the second wavelength band can be emitted from a region having a small area, whereby the amount of light flux per unit area can be increased. Therefore, the light source apparatus can not only be simplified and compact but also efficiently uses the excitation light to output high-luminance light of the second wavelength band, for example, white light, red light, green light, or any other range of visible light.

In the first aspect described above, the reflection element may include an inclined portion so as to reflect at least part of the second excitation light outputted from the second light emitting region in such a manner that the at least part of the second excitation light enter the phosphor layer, the inclined portion being inclined with respect to a plane perpendicular to a principal ray of the light emitted from the phosphor layer.

According to the configuration described above, at least part of the second excitation light outputted from the second light emitting region is allowed to be reflected off the inclined portion of the reflection element and incident on the phosphor layer. Therefore, the excitation light can be effectively used without employing a complicated structure but by using the simple configuration, and both the front and rear surfaces of the phosphor layer can be irradiated with the excitation light.

In the first aspect described above, the inclined portion may have a curved surface concave toward the phosphor layer.

According to the configuration described above, the second excitation light outputted from the second light emitting region at a large angle with respect to the principal ray can also be efficiently reflected toward the phosphor layer.

In the first aspect described above, the phosphor layer may be in thermally contact with the light emitting device.

According to the configuration described above, since the phosphor layer is thermally in contact with the light emitting device, heat generated by the phosphor layer can be efficiently dissipated. Thermal degradation of the phosphor layer is therefore suppressed, whereby the phosphor layer can output light in a stable manner for a long period.

In the first aspect described above, the light guide section may be formed of a light collection system.

According to the configuration described above, at least part of the second excitation light outputted from the second light emitting region of the light source is reflected off the reflection element, passes through the light guide section, and enters the phosphor layer. The light source apparatus can therefore efficiently output light of the second wavelength band.

In the first aspect described above, the first light emitting region may be provided in a portion of one side of the light emitting region of the light emitting device, and the second light emitting region may be provided in the rest of the light emitting region.

According to the configuration described above, the second excitation light outputted from the second light emitting region can be efficiently guided to the phosphor layer by using the light collection system having a simple configuration. Further, since the phosphor layer has a simple structure in which it is provided on a portion of one side of the light emitting region, the phosphor layer can be readily provided in a desired position, and the light source apparatus can be further readily manufactured.

In the first aspect described above, the phosphor layer may be so provided that the phosphor layer includes a region symmetrical to the second light emitting region with respect to the optical axis of the light collection system.

According to the configuration described above, the second excitation light outputted from the second light emitting region is allowed to enter the phosphor layer from the side facing away from the light source with no loss. The light source apparatus can therefore output higher-luminance light of the second wavelength band.

In the first aspect described above, the light source apparatus may further include a correction section that corrects the traveling direction of the light of the second wavelength band having passed through the reflection element.

Since the phosphor layer is provided in the first light emitting region, which is part of the light emitting region of the light source, the optical axis of the light reflected off the reflection element is inclined to the optical axis of the light collection system.

According to the configuration described above, since the light source apparatus includes the correction section, the inclination with respect to the optical axis of the light collection system can be corrected. As a result, the light source apparatus according to the first aspect of the invention can irradiate illumination targets with the light of the second wavelength band with the amount of loss thereof suppressed.

In the first aspect described above, the first light emitting region may be provided in a portion of one side of the light emitting region of the light emitting device, the second light emitting region may be provided in the rest of the light emitting region, and the correction section may have a wedge-like shape so configured that a portion thereof facing the phosphor layer is thicker than a portion thereof facing the second light emitting region.

According to the configuration described above, since the light source apparatus includes the wedge-shaped correction section described above, the light having exited out of the reflection element can be so corrected that the optical axis thereof is parallel to the optical axis of the light collection system. Further, the correction section, which has a simple wedge-like shape, can be readily manufactured.

In the first aspect described above, the light source apparatus may further include a first lens array that is disposed on an optical path of the light of the second wavelength band having passed through the reflection element and has a plurality of first lenses and a second lens array that is disposed on the light exiting side of the first lens array and has a plurality of second lenses provided in correspondence with the plurality of first lenses. The first light emitting region may be provided in a portion of one side of the light emitting region of the light emitting device. The second light emitting region may be provided in the rest of the light emitting region. The optical axis of each of the plurality of first lenses may be shifted from the optical axis of the corresponding second lens. The first lenses may serve as the correction section.

According to the configuration described above, since the light source apparatus includes the first lens array and the second lens array, the in-plane optical intensity distribution over the surface of each of the illumination targets can be substantially uniform. Further, since the correction section is formed of the first lens array, the inclination of the optical axis of the light having exited out of the reflection element can be corrected without any increase in the number of parts.

In the first aspect described above, the shapes of the first light emitting region and the second light emitting region in a plane perpendicular to the optical axis of the light collection system may be similar to each other.

According to the configuration described above, even when the distance between the second light emitting region and the light collection system and the distance between the light collection system and the phosphor layer differ from each other, the phosphor layer can be efficiently irradiated with the second excitation light outputted from the second light emitting region. Therefore, the phosphor layer can be efficiently irradiated with the second excitation light outputted from the second light emitting region with an increase in the degree of freedom in arranging the light source and the phosphor layer with respect to the light collection system.

In the first aspect described above, the area of the phosphor layer may be smaller than the area of the light emitting device.

According to the configuration described above, since the phosphor layer emits light of the second wavelength band from a region having an area smaller than the area of the light emitting device, whereby the amount of light flux per unit area can be increased.

In the first aspect described above, the first light emitting region and the second light emitting region may be rectangular when viewed in a direction along the optical axis of the light collection system.

According to the configuration described above, each of the illumination targets is irradiated with the light having exited out of the light source apparatus and having a rectangular shape in a plane perpendicular to the outputted light, whereby the light source apparatus can efficiently illuminate the illumination target having a rectangular irradiated surface.

In the first aspect described above, the areas of the first light emitting region and the second light emitting region in a plane perpendicular to the optical axis of the light collection system may be equal to each other.

According to the configuration described above, the phosphor layer can be effectively irradiated with the second excitation light outputted from the second light emitting region. The light source apparatus can therefore output higher-luminance light of the second wavelength band.

In the first aspect described above, the light source may have a light emitting diode or a semiconductor laser that outputs the excitation light.

According to the configuration described above, since a light emitting diode is compact and has high light emission efficiency, and a semiconductor laser outputs light that can be focused into a small spot, the efficiency at which the excitation light, which causes the phosphor layer to emit light, is used can be increased.

A second aspect of the invention provides a projector including the light source apparatus according to the first aspect described above, a light modulator that modulates light having exited cut of the light source apparatus in accordance with image information, and a projection lens that projects modulated light from the light modulator.

Since the configuration of the projector according to the second aspect includes the light source apparatus described above, the projector can be compact and project a bright image.

In the second aspect described above, the following expression may be satisfied: $\Omega a \leq Sb \times \Omega b/Sa$, where $\Omega a$ is the solid angle corresponding to the reflection element viewed from the center of the light emitting device, Sa is the area of the light emitting device, Sb is the area of the light modulator, and $\Omega b$ is the solid angle defined by one-half the collection angle of the projection lens.

The configuration described above allows extraction of light formed of effective angular components that can be efficiently incident on the projection lens, whereby a bright image can be projected.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
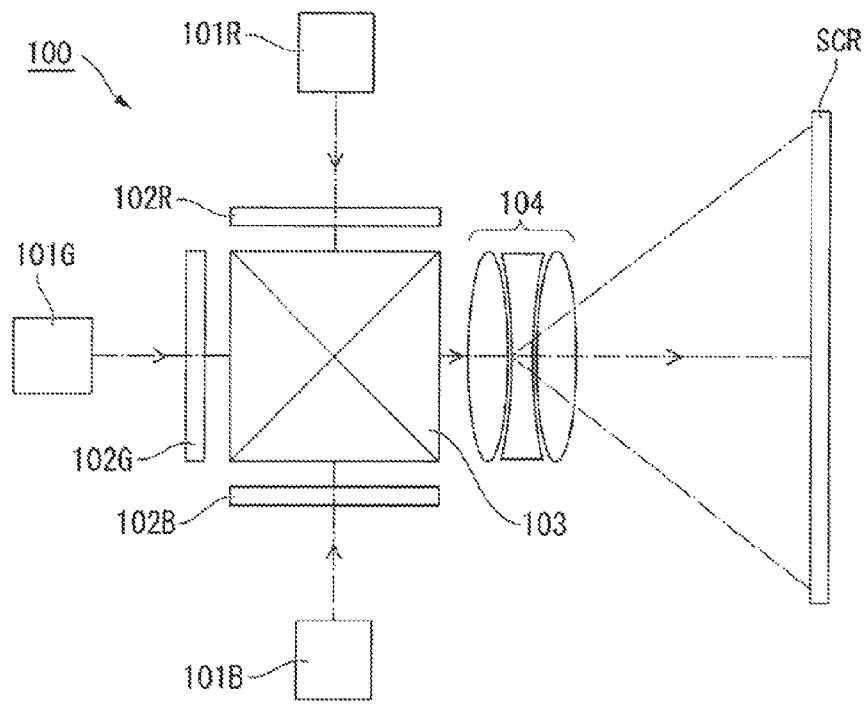
FIG. 1 is a plan view showing a schematic configuration of a projector according to a first embodiment.

Embodiments of the invention will be described below in detail with reference to the drawings.

In the drawings used in the following description, a characteristic part is for convenience enlarged for ease of illustration of the characteristic in some cases, and the dimensional ratio of each component is therefore not necessarily equal to an actual dimensional ratio.

Projector

An example of a projector 100 according to a first embodiment shown in FIG. 1 will first be described.

FIG. 1 is a plan view showing a schematic configuration of the projector 100.

The projector according to the present embodiment is a projection-type image display apparatus that displays color video images (still images) on a screen (projection surface).

Specifically, the projector 100 includes light source apparatus 101R, 101G, and 101B, light modulators 102R, 102G, and 102B, a light combining system 103, and a projection lens 104.

The light source apparatus 101R, 101G, and 101B output red light (R), green light (G), and blue light (B), respectively.

The light source apparatus 101R is formed of a light source apparatus according to an embodiment of the invention. The light source apparatus 101G and 101B use LEDs that output green (G) light and blue (B) light as light sources, as will be described later. The light source apparatus 101R, 101G, and 101B output the illumination light fluxes toward the light modulators 102R, 102G, and 102B, respectively.

The light modulators 102R, 102G, and 102B modulate the light fluxes from the light source apparatus 101R, 101G, and 101B in accordance with image signals to form image light fluxes corresponding to the colors.

Each of the light modulators 102R, 102G, and 102B is formed of a liquid crystal light valve (liquid crystal panel) and forms image light by modulating the illumination light of the corresponding color in accordance with image information. A polarizer (not shown) is disposed on each of the light incident side and the light exiting side of each of the light modulators 102R, 102G, and 102B, and the polarizer transmits only light linear polarized in a specific direction (S-polarized light, for example).

The light combining system 103 combines the image light fluxes from the light modulators 102R, 102G, and 102B with one another.

The light combining system 103 is formed of a cross dichroic prism on which the image light fluxes from the light modulators 102R, 102G, and 102B are incident. The light combining system 103 combines the image light fluxes corresponding to the colors with one another and outputs the combined image light toward the projection lens 104.

The projection lens 104 is formed of a group of projection lenses and enlarges and projects the combined image light from the light combining system 103 toward a screen SCR. Enlarged color video images (still images) are thus displayed on the screen SCR.

Light Source Apparatus

A specific configuration of the light source apparatus 101R, which is a light source apparatus according to a first embodiment of the invention, will subsequently be described.

Figure 2:
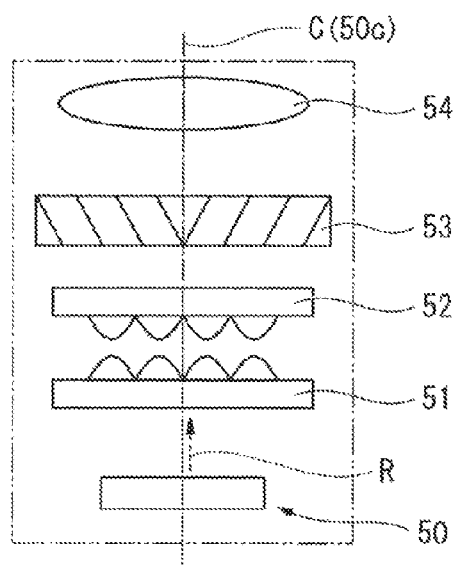
FIG. 2 is a plan view showing a schematic configuration of a light source apparatus according to the first embodiment.

FIG. 2 is a plan view showing a schematic configuration of the light source apparatus 101R.

The light source apparatus 101R includes at least a light source section 50, as shown in FIG. 2. In the present embodiment, the light source apparatus 101R further includes a first lens array 51, a second lens array 52, a polarization conversion element 53, and a superimposing lens 54.

The light source section 50 outputs red light. The first lens array 51 has a plurality of first lenses and divides the light having exited out of the light source section 50 into a plurality of sub-light fluxes. The second lens array 52 is disposed on the light exiting side of the first lens array 51 and has a plurality of second lenses corresponding to the first lenses. The second lens array 52 along with the superimposing lens 54 superimposes the plurality of sub-light fluxes on one another on the light modulator 102R. The polarization conversion element 53 converts non-polarized light having exited out of the second lens array 52 into linearly polarized light.

The light source section 50 in the light source apparatus 101R will now be described in detail.

Figure 3A:
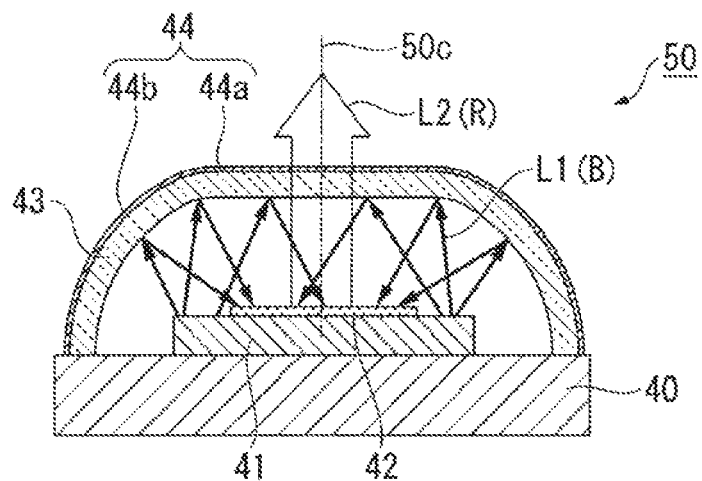
FIGS. 3A and 3B show the configuration of key portions of a light source section.
Figure 3B:
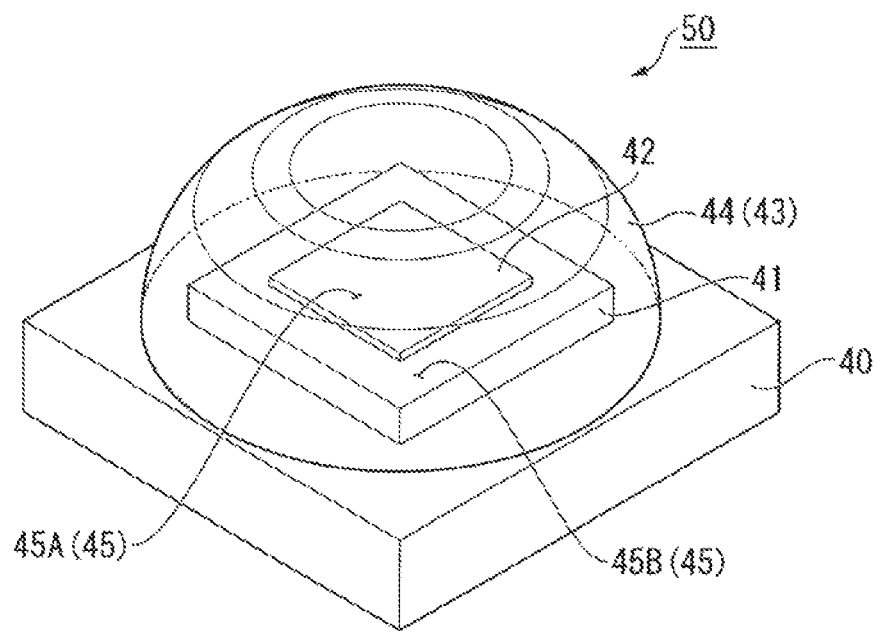
Figure 4:
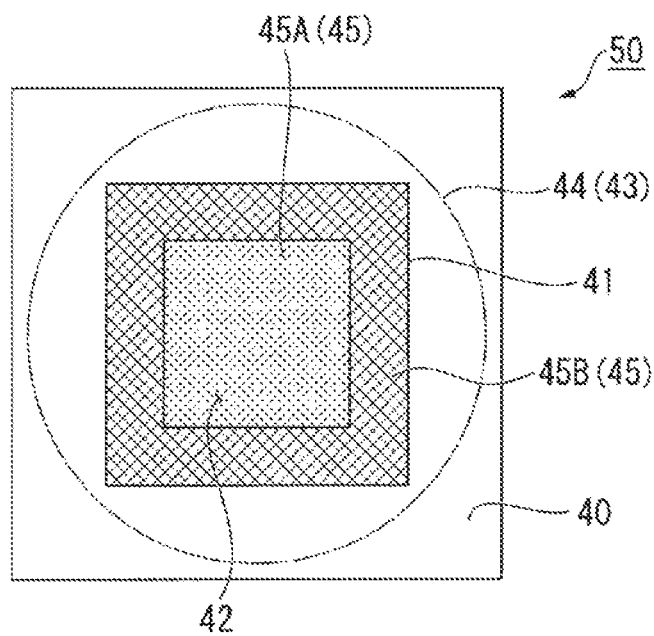
FIG. 4 is a plan view of the light source section.

FIGS. 3A and 3B show the configuration of key portions of the light source section 50, and FIG. 4 is a plan view of the light source section 50.

The light source section 50 includes a substrate 40, an LED device (light emitting device) 41, a phosphor layer 42, a transparent medium 43, and a dichroic mirror (reflection element) 44, as shown in FIGS. 3A and 3B. The substrate 40 supports the LED device 41. The LED device 41 outputs excitation light of a first wavelength band. In the present embodiment, the LED device 41 is formed of a light emitting diode that emits light of a wavelength band containing blue (B) as the first wavelength band. The light of the first wavelength band is not limited to blue light and may instead be light of a wavelength band containing violet or ultraviolet light. The LED device may be replaced with a semiconductor laser.

The phosphor layer 42, when excited with the blue light outputted from the LED device 41, emits light of a second wavelength band different from the first wavelength band. In the present embodiment, the phosphor layer 42 is made of a red phosphor (material containing $CaAlSiN_3$—$Si_2N_2O$:Eu, for example) that emits light of a wavelength band containing red (R) as the second wavelength band.

The transparent medium 43 is a light-transmissive medium made, for example, of a glass or plastic material and is so disposed on the substrate 40 that the transparent medium 43 accommodates the LED device 41 and the phosphor layer 42. The transparent medium 43 is a support member for supporting the dichroic mirror 44, which will be described later. The transparent medium 43 has a substantially bowl-like shape and has a curved surface concave toward the phosphor layer 42, as shown in FIGS. 3A and 3B.

The transparent medium 43 and an air layer are provided between the dichroic mirror 44 and the phosphor layer 42. That is, in the present embodiment, the light source section 50 includes a light guide section formed of the transparent medium 43 and the air layer and located between the dichroic mirror 44 and the phosphor layer 42.

The dichroic mirror (reflection element) 44 is formed on the front surface of the transparent medium 43. The dichroic mirror 44 reflects light L1 of the first wavelength band (blue light B) outputted from the LED device 41 and transmits light L2 of the second wavelength band (red light R) outputted from the phosphor layer 42.

In the present embodiment, the dichroic mirror 44 has an upper surface portion 44a, which a principal ray 50c of the red light L2 outputted from the phosphor layer 42 intersects at right angles, and an inclined portion 44b, which is inclined with respect to the principal ray 50c. It is noted that the principal ray 50c of the red light L2 is parallel to an optical axis C of the first lens array 51, the second lens array 52, the polarization conversion element 53, and the superimposing lens 54 (see FIGS. 2 and 3A).

The LED device 41 has a rectangular light emitting region 45, as shown in FIGS. 3B and 4. The light emitting region 45 has a first light emitting region 45A and a second light emitting region 45B. The first light emitting region 45A has a rectangular shape and is provided in a central region of the light emitting region 45. The second light emitting region 45B is the rest of the light emitting region 45. The second light emitting region 45B surrounds the first light emitting region 45A and has a rectangular exterior contour. In the present specification, excitation light outputted from the first light emitting region 45A is called first excitation light, and excitation light outputted from the second light emitting region 45B is called second excitation light for convenience.

The phosphor layer 42 coincides with the first light emitting region 45A in a plan view. In other words, in the light emitting region 45, the region where the phosphor layer 42 is provided serves as the first light emitting region 45A, and the region where no phosphor layer 42 is provided serves as the second light emitting region 45B.

In the present embodiment, the phosphor layer 42 is thermally in contact with the LED device 41. As a result, when the phosphor layer 42 emits fluorescence, heat generated by the phosphor layer 42 is efficiently dissipated through the LED device 41. Thermal degradation of the phosphor layer 42 is therefore suppressed, whereby the phosphor layer 42 can output light in a stable manner for a long period.

Light output operation of the light source apparatus 101R will subsequently be described.

The blue light L1 outputted from the first light emitting region 45A of the LED device 41 is incident on the rear surface of the phosphor layer 42, which is layered on the upper surface of the LED device 41. The phosphor layer 42 excited with a large part of the blue light L1 outputted from the first light emitting region 45A outputs the red light L2.

In the present embodiment, the area of the phosphor layer 42 is smaller than the area of the LED device 41. The phosphor layer 42 therefore emits the red light L2 from a region having an area smaller than the area of the LED device 41, whereby the amount of light flux per unit area can be increased.

On the other hand, blue light having passed through the phosphor layer 42 without contributing to the excitation and the blue light L1 outputted from the second light emitting region 45B of the LED device 41 reach the dichroic mirror 44, which reflects the blue light L1 and transmits the red light L2.

The blue light L1 having exited out of the second light emitting region 45B of the LED device 41 spreads in all directions. Further, since the light guide section is provided between the dichroic mirror 44 and the phosphor layer 42, the upper surface portion 44a of the dichroic mirror 44 and the phosphor layer 42 are set apart from each other. As a result, the blue light L1 having exited out of the second light emitting region 45B in all directions and having been reflected off the upper surface portion 44a or the inclined portion 44b of the dichroic mirror 44 can be incident on the phosphor layer 42 in a satisfactory manner. Further, since the inclined portion 44b has a curved surface concave toward the phosphor layer 42, the blue light L1 outputted from the second light emitting region 45B at a large angle with respect to the principal ray 50c is also efficiently reflected off the inclined portion 44b toward the surface of the phosphor layer 42. The blue light L1, which is excitation light, can therefore excite both the front and rear surfaces of the phosphor layer 42 in a satisfactory manner, whereby the phosphor layer 42 can efficiently produce the red light L2.

Based on the configuration described above, the light source apparatus 101R can output the red light L2 outward through the dichroic mirror 44 (toward first lens array 51) because the phosphor layer 42 absorbs a large part of the excitation blue light L1 in the repetitive reflection process. That is, the light source apparatus 101R outputs the red light L2 (linearly polarized light) toward the light modulator 102R.

The light source apparatus 101G outputs green (linearly polarized) light toward the light modulator 102G, and the light source apparatus 101B outputs blue (linearly polarized) light toward the light modulator 102B. The light source apparatus 101G and 101B are typical light source apparatus of related art using LEDs that correspond to green (G) and blue (B) and serve as the light source sections. No detailed description thereof will therefore be made.

According to the light source apparatus 101R having the configuration described above, at least part of the blue light L1 outputted from the second light emitting region 45B is allowed to be reflected off the inclined portion 44b of the dichroic mirror 44 and incident on the phosphor layer 42. Therefore, the blue light L1, which is excitation light, can be effectively used without employing a complicated structure but by using the simple configuration, whereby both the front and rear surfaces of the phosphor layer 42 can be efficiently irradiated with the blue light L1. The light source apparatus 101R can therefore efficiently output the red light L2.

Therefore, using the light source apparatus 101R in the projector 100 allows further reduction in size of the projector 100 itself and display of an image that is bright and excels in image quality.

The description has been made with reference to an embodiment of the invention by way of example, but the invention is not necessarily limited to the embodiment described above, and a variety of changes can be made thereto to the extent that the changes do not depart from the substance of the invention.

A variation of the light source apparatus 101R will be described. The present variation differs from the embodiment described above only in terms of the configuration of the light source section in the light source apparatus 101R and the other configurations are the same. Therefore, in the following description, the configuration of the light source section will be primarily described, and the same configurations and members as those in the embodiment described above have the same reference characters and will not be described in detail.

First Variation

Figure 5:
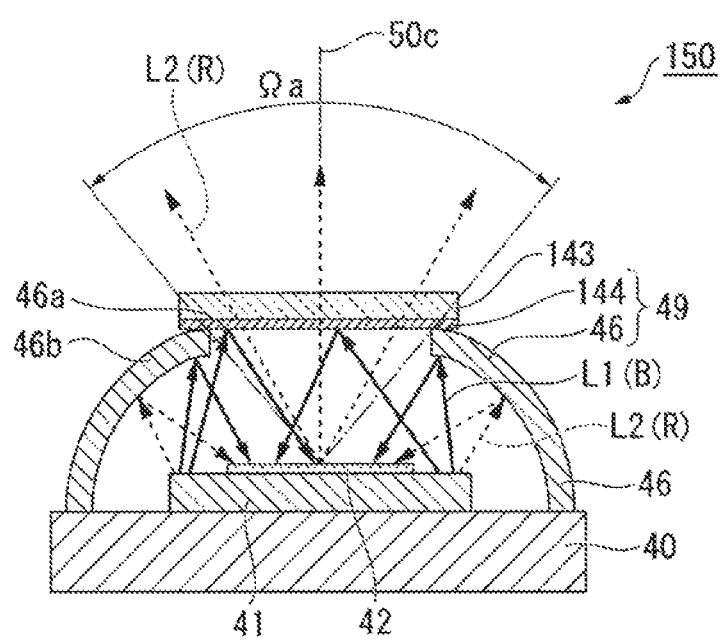
FIG. 5 shows the configuration of a light source section according to a first variation.

FIG. 5 shows the configuration of a light source section according to a first variation.

A light source section 150 according to the present variation includes the substrate 40, the LED device 41, the phosphor layer 42, a mirror member (reflection element) 49, and a transparent medium 143, as shown in FIG. 5.

The mirror member 49 includes a first mirror member 46 and a second mirror member 144. The first mirror member 46 is so disposed on the substrate 40 that the mirror member 46 accommodates the LED device 41 and the phosphor layer 42. The first mirror member 46 has a substantially bowl-like shape and has a curved surface concave toward the phosphor layer 42, as the transparent medium 43 shown in FIGS. 3A and 3B.

The first mirror member 46 has an opening 46a, which is formed in an upper surface portion thereof that faces the upper surface of the phosphor layer 42 and that the principal ray 50c of the red light L2 outputted from the phosphor layer 42 intersects at right angles, and an inclined portion 46b, which is inclined with respect to the principal ray 50c. That is, the first mirror member 46, specifically, the inclined portion 46b having a ring-like shape surrounds the phosphor layer 42 in a plan view. Further, the opening 46a has, for example, a circular shape in a plan view. The first mirror member 46 is made, for example, of a material having light reflectivity, such as aluminum.

The transparent medium 143 is a light-transmissive medium made, for example, of a glass or plastic material, and serves as a support member for supporting the second mirror member 144. The second mirror member is formed of a dichroic mirror. The second mirror member 144 is formed on the inner surface of the transparent medium 143. The transparent medium 143 is so disposed on the mirror member 49 that the second mirror member 144 faces the opening 46a. The opening 46a is blocked with the second mirror member 144. The second mirror member 144 is so disposed that the principal ray 50c intersects the second mirror member 144 at right angles.

An air layer is interposed between the mirror member 49 and the phosphor layer 42. That is, in the present embodiment, the light source section 150 includes a light guide section formed of the air layer and located between the mirror member 49 and the phosphor layer 42.

In the present variation, let Ωa be the solid angle corresponding to the opening 46a viewed from the center of the phosphor layer 42, Sa be the area of the phosphor layer 42, Sb be the area of a light incident surface of the light modulator 102R on which the red light L2 is incident, and Ωb be the solid angle determined by one-half a light collection angle θ of the projection lens 104 (see FIG. 1). Ωa is set to be smaller than or equal to Sb×Ωb/Sa.

Ωb is defined as: Ωb=2π(1−cos θ).

When Ωa is greater than Sb×Ωb/Sa, a region illuminated with the red light L2 is undesirably greater than an effective region of the light modulator 102R, or the red light L2 enters the projection lens 104 at a large angle of incidence and part of the red light L2 hence cannot undesirably pass through the projection lens 104.

In contrast, the light source section 150 according to the present variation is so configured that the relationship described above is satisfied. Therefore, according to the present variation, part of the blue light L1 outputted from the second light emitting region 45B or part of the red light L2 outputted from the phosphor layer 42, specifically, light components each inclined with respect to the principal ray 50c by a large angle are allowed to be reflected off the inclined portion 46b of the first mirror member 46 back to the phosphor layer 42. The light having returned back to the phosphor layer 42 is scattered in the phosphor layer 42 and exits out thereof at a different angle. As a result, only red light L2 having effectively usable angular components can be extracted through the opening 46a out of the light source section. That is, the effective region of the light modulator 102R is efficiently illuminated with the red light L2 having exited out the light source section 150, and then the red light L2 efficiently enters the projection lens 104, whereby a bright image can be projected on the screen SCR.

Second Variation

Figure 6A:
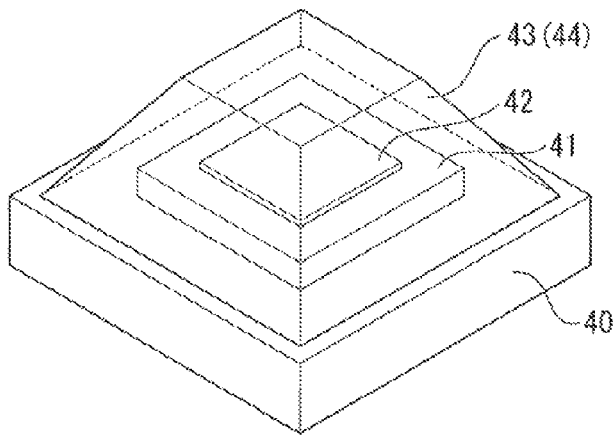
FIGS. 6A to 6C show the configurations of light source sections according to a second variation.
Figure 6B:
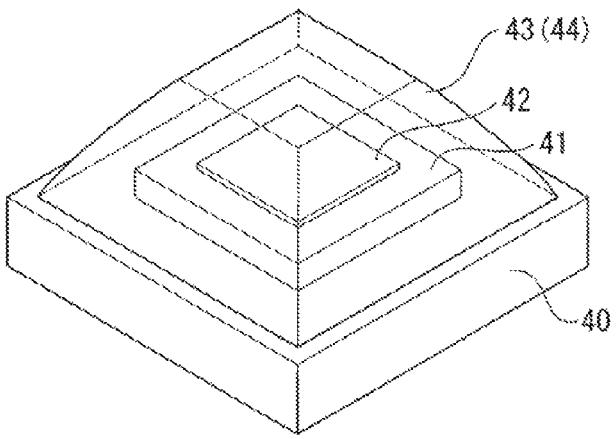

For example, in the embodiment described above, the transparent medium 43 (dichroic mirror 44) has a substantially bowl-like shape by way of example, but the invention is not necessarily configured this way. For example, the transparent medium 43 (dichroic mirror 44) may have a square shape in a plan view and a trapezoidal cross-sectional shape, as shown in FIG. 6A. Instead, the transparent medium 43 (dichroic mirror 44) may have a square shape in a plan view as shown in FIG. 6B, and the bowl-like cross-sectional shape shown in FIGS. 3A and 3B.

Figure 6C:
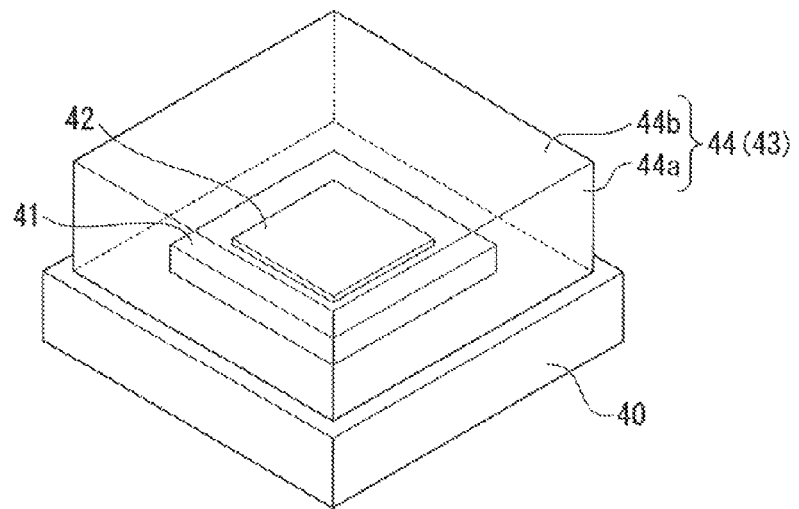

Still instead, the transparent medium 43 (dichroic mirror 44) may have a rectangular shape in a plan view and a rectangular cross-sectional shape, as shown in FIG. 6C. In this case, the dichroic mirror 44 formed on the surface of the transparent medium 43 has an inclined portion 44b parallel to the principal ray 50c.

Third Variation

Figure 7A:
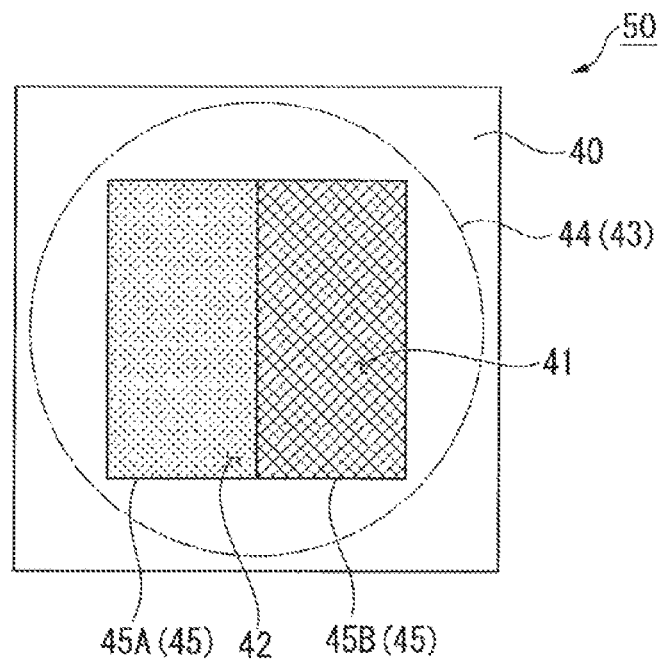
FIGS. 7A and 7B show the configurations of light source sections according to a third variation.

In the embodiment described above, the second light emitting region 45B surrounds the first light emitting region 45A by way of example, but the invention is not necessarily configured this way. For example, in the example shown in FIG. 7A, the first light emitting region 45A is provided in a portion of one side of the light emitting region 45. The area of the portion where the first light emitting region 45A is provided is substantially one-half of the area of the light emitting region 45, and the second light emitting region 45B is provided in the rest of the light emitting region 45. Each of the first light emitting region 45A and the second light emitting region 45B has a rectangular shape, and they have substantially the same area. The first light emitting region 45A and the second light emitting region 45B are symmetrically disposed with respect to the optical axis C.

Figure 7B:
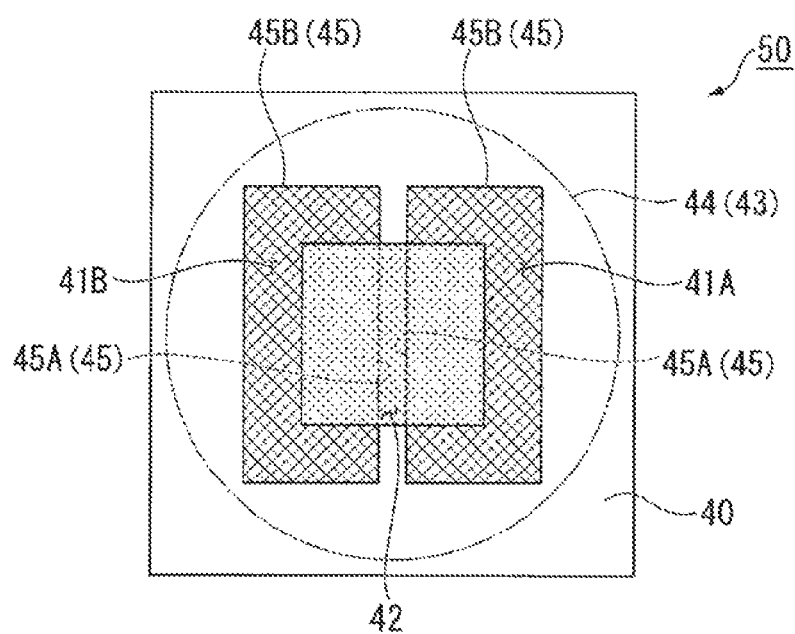

In the embodiment described above, the LED device 41 and the phosphor layer 42 are disposed in a one-to-one correspondence by way of example, but the invention is not necessarily configured this way. For example, an LED device 41A and an LED device 41B may be disposed on the substrate 40, as shown in FIG. 7B. In this configuration, the phosphor layer 42 is so layered on the LED devices 41A and 41B that the phosphor layer 42 partially covers both the two LED devices 41A and 41B.

A first light emitting region 45A of the LED device 41A is provided in a left central region of a light emitting region 45 of the LED device 41A, and a second light emitting region 45B of the LED device 41A is provided in the rest of the light emitting region 45, as shown in FIG. 7B. Similarly, a first light emitting region 45A of the LED device 41B is provided in a right central region of a light emitting region 45 of the LED device 41B, and a second light emitting region 45B of the LED device 41B is provided in the rest of the light emitting region 45.

The first light emitting region 45A of the LED device 41A and the first light emitting region 45A of the LED device 41B are set apart from each other, and the second light emitting region 45B of the LED device 41A and the second light emitting region 45B of the LED device 41B are set apart from each other.

Fourth Variation

Figure 8:
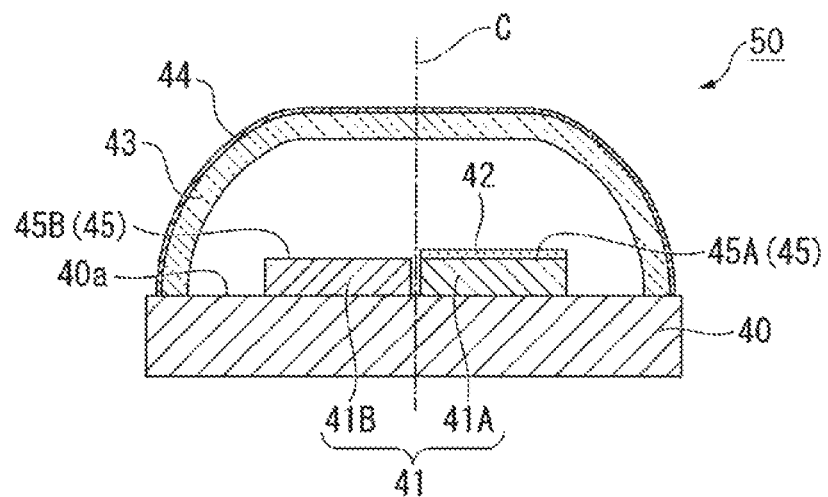
FIG. 8 shows the configuration of a light source section according to a fourth variation.

When two LED devices 41 are used as shown in FIG. 7B, the phosphor layer 42 may be disposed only on the LED device 41A, which is one of the LED devices, as shown in FIG. 8. Specifically, the light source section 50 has two LED devices 41A and 41B, which are disposed on the substrate 40, as shown in FIG. 8. The substrate 40 has a reference surface 40a perpendicular to the optical axis C.

The area of the light emitting region of the LED devices 41A is the same as that of the light emitting region of the LED devices 41B, and the shape of the light emitting region of the LED devices 41A is identical to the shape of the light emitting region of the LED devices 41B. The phosphor layer 42 is applied to the light emitting region of the LED device 41A.

The LED device 41A and the LED device 41B are disposed on opposite sides of the optical axis C, and the phosphor layer 42 is provided on the LED device 41A, which is one of the LED devices. In the light source section 50, the height of the light emitting surface of the LED device 41A measured from the reference surface 40a is equal to the height of the light emitting surface of the LED device 41B measured from the reference surface 40a. The number of LED devices 41 is not limited to two and may be three or more.

Fifth Variation

Figure 9:
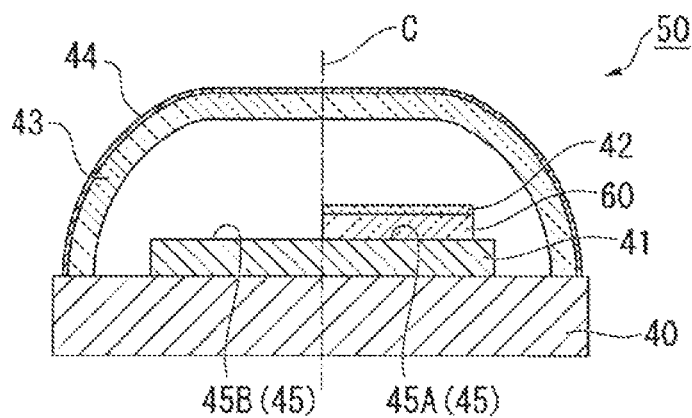
FIG. 9 shows the configuration of a light source section according to a fifth variation.

In the embodiment described above, the phosphor layer 42 is layered on the LED device 41 by way of example, but the invention is not necessarily configured this way. For example, the phosphor layer 42 may be provided on a transparent member separate from the LED device 41. FIG. 9 is a diagrammatic view showing a light source section 50 and a phosphor layer 42 according to the variation. The phosphor layer 42 may be layered on (applied onto) a plate-shaped transparent member 60 having an area about one-half the area of the light emitting region of the LED device 41, and the resultant structure may be disposed on one side of the optical axis C, that is, on one side of the light emitting region of the LED device 41, as shown in FIG. 9.

In the embodiment described above, the area of the phosphor layer 42 is smaller than the area of the LED device 41 by way of example, but the invention is not necessarily configured this way. For example, the phosphor layer 42 and the LED device 41 may have the same area and may be disposed in positions shifted from each other in a plan view.

In the embodiment described above, the phosphor layer 42 has a rectangular shape in a plan view by way of example, but the invention is not necessarily configured this way. For example, the phosphor layer 42 may have a circular, triangular, rhombic, trapezoidal, or any other shape in a plan view. Further, in the configuration shown in FIG. 5, the opening 46a has a circular shape in a plan view by way of example, but the shape of the opening 46a is not limited thereto. For example, the opening 46a may have a rectangular shape in a plan view. Instead, the shape of the opening 46a may be similar to the shape of the phosphor layer 42 in correspondence with the shape of the phosphor layer 42 in a plan view. In this case, since the shape of the phosphor layer 42 is similar to the shape of the opening 46a, the red light L2 emitted in all directions from the outer circumference of the phosphor layer 42 can be efficiently captured within the opening 46a.

In the embodiment described above, a light source apparatus according to an embodiment of the invention is used as the light source apparatus 101R, which produces the red light L2, by way of example, but the invention is not necessarily configured this way. A light source apparatus according to an embodiment of the invention may be used as the light source apparatus 101G, which produces green light, or the light source apparatus 101B, which produces blue light, along with a different phosphor layer.

In the embodiment described above, the projector 100 including the three light modulators 102R, 102G, and 102B is presented by way of example. Instead, the invention is also applicable to a projector in which a single light modulator displays color video images (still images). Further, each of the light modulators is not limited to the liquid crystal panel described above and can, for example, be a digital mirror device.

Second Embodiment

A projector according to a second embodiment will be described below with reference to the drawings.

The projector according to the present embodiment modulates light fluxes outputted from light source apparatus in accordance with image information and enlarges and projects the modulated light fluxes on a screen or any other projection surface.

Figure 10:
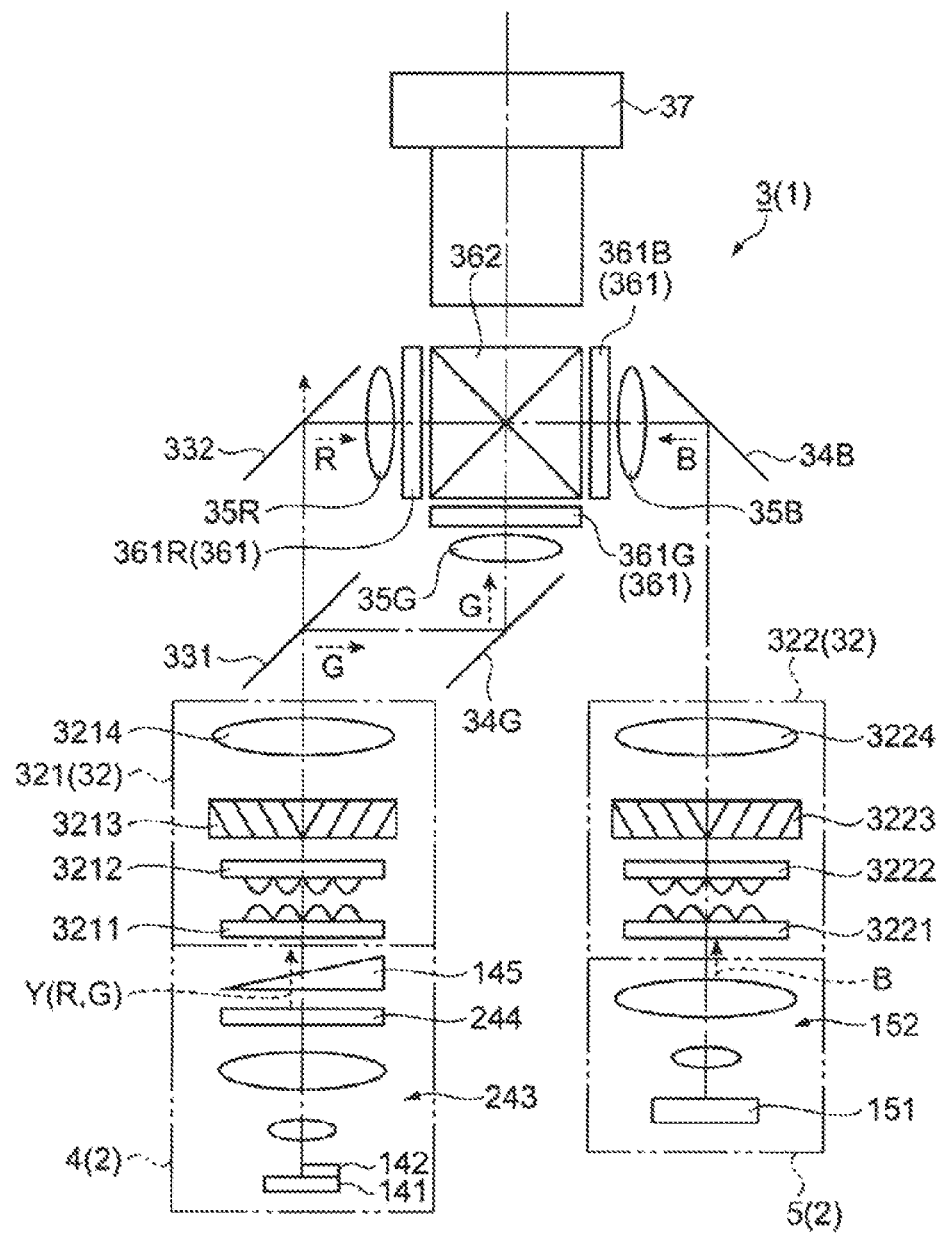
FIG. 10 is a diagrammatic view showing an optical unit in a projector according to a second embodiment.

FIG. 10 is a diagrammatic view showing an optical unit 3 in a projector 1 according to the present embodiment.

The projector 1 includes the optical unit 3, which has a light source apparatus 2, and further includes, although not shown, a controller, a power supply, a cooler, and an exterior enclosure that accommodates the components described above, as shown in FIG. 10.

The controller includes a CPU (central processing unit), a ROM (read only memory), a RAM (random access memory), and other components and functions as a computer. The controller controls the action of the projector 1, for example, controls image projection.

The power supply supplies the light source apparatus 2, the controller, and other components with electric power.

The cooler cools the light source apparatus 2 and the power supply.

The exterior enclosure, although not described in detail, is formed of a plurality of members and has, for example, an intake port through which outside air is introduced and a discharge port through which heated air in the exterior enclosure is discharged out thereof.

Configuration of Optical Unit

The optical unit 3 optically processes light having exited out of the light source apparatus 2 and projects the processed light under the control of the controller.

The optical unit 3 includes not only the light source apparatus 2 but also an optical integration illumination system 32, dichroic mirrors 331 and 332, reflection mirrors 34B and 34G, field lenses 35B, 35G, and 35R, liquid crystal light valves 361 as light modulators, a cross dichroic prism 362 as a light combining apparatus, and a projection lens 37, as shown in FIG. 10.

The liquid crystal light valves 361 are formed of a liquid crystal light valve 361R, which modulates red light (hereinafter referred to as "R light") in accordance with image information, a liquid crystal light valve 361G, which modulates green light (hereinafter referred to as "G light") in accordance with image information, and a liquid crystal light valve 361B, which modulates blue light (hereinafter referred to as "B light") in accordance with image information.

Each of the liquid crystal light valves 361 has a transmissive liquid crystal panel, a light-incident-side polarizer disposed on the light incident side of the liquid crystal panel, and a light-exiting-side polarizer disposed on the light exiting side of the liquid crystal panel.

Each of the liquid crystal light valves 361 has a rectangular image formation region having a plurality of minute pixels (not shown) arranged in a matrix. The pixels are each set to have light transmittance according to a display image signal and form a display image in the image formation region. The color light fluxes are modulated by the liquid crystal light valves 361 and then outputted toward the cross dichroic prism 362.

The cross dichroic prism 362 is formed by bonding four rectangular prisms and hence has a substantially square shape in a plan view, and two dielectric multilayer films are formed on the interfaces between the bonded rectangular prisms. In the cross dichroic prism 362, the dielectric multilayer films reflect the color light fluxes modulated by the liquid crystal light valves 361R and 361B and transmit the color light flux modulated by the liquid crystal light valve 361G to combine the color light fluxes with one another.

The projection lens 37 has a plurality of lenses (not shown) and enlarges and projects the combined light from the cross dichroic prism 362 on the screen.

The light source apparatus 2 includes a first light source apparatus 4 and a second light source apparatus 5.

The first light source apparatus 4 corresponds to the light source apparatus according to the appended claims. The first light source apparatus 4 includes a light source 141 having a light emitting diode, a phosphor layer 142 applied onto part of the light emitting region of the light source (light emitting device) 141, a light collection system (light guide section) 243, a wavelength selection element (reflection element) 244, and a correction section 145. The correction section 145 is, however, not essentially required. Excitation light outputted from the light source 141 causes the phosphor layer 142 to emit Y light containing R light and G light.

The second light source apparatus 5 includes a light source 151, which has a light emitting diode that outputs B light, and a parallelizing lens 152, which substantially parallelizes the B light outputted from the light source 151 and outputs the parallelized B light.

The configuration of the first light source apparatus 4 will be described later in detail.

The optical integration illumination system 32 includes a first optical integration illumination system 321 corresponding to the first light source apparatus 4 and a second optical integration illumination system 322 corresponding to the second light source apparatus 5.

The first optical integration illumination system 321 includes a first lens array 3211, a second lens array 3212, a polarization conversion element 3213, and a superimposing lens 3214.

The first lens array 3211 has a plurality of first lenses and divides light having exited out of the first light source apparatus 4 into a plurality of sub-light fluxes. The second lens array 3212 is disposed on the light exiting side of the first lens array 3211 and has a plurality of second lenses provided in correspondence with the first lenses. The second lens array 3212 along with the superimposing lens 3214 superimposes the sub-light fluxes on one another on the liquid crystal light valves 361G and 361R.

The polarization conversion element 3213 converts non-polarized light having exited out of the second lens array 3212 into linearly polarized light.

The second optical integration illumination system 322, as in the case of the first optical integration illumination system 321, includes a first lens array 3221, a second lens array 3222, a polarization conversion element 3223, and a superimposing lens 3224, divides the B light having exited out of the second light source apparatus 5 into a plurality of sub-light fluxes, and superimposes the sub-light fluxes on one another on the surface of the liquid crystal light valves 361B, which will be described later.

The B light having exited out of the second optical integration illumination system 322 is reflected off the reflection mirror 34B and incident on the liquid crystal light valve 361B via the field lens 35B.

The dichroic mirror 331, which receives the Y light having exited out of the first optical integration illumination system 321, reflects G light to be used for image formation and transmits the remaining light.

The G light reflected off the dichroic mirror 331 is reflected off the reflection mirror 34G and incident on the liquid crystal light valve 361G via the field lens 35G.

The dichroic mirror 332, which receives the light having passed through the dichroic mirror 331, reflects R light to be used for image formation and transmits unnecessary light. The R light reflected off the dichroic mirror 332 is incident on the liquid crystal light valve 361R via the field lens 35R.

Configuration of First Light Source Apparatus

The first light source apparatus 4 will now be described in detail.

Figure 11A:
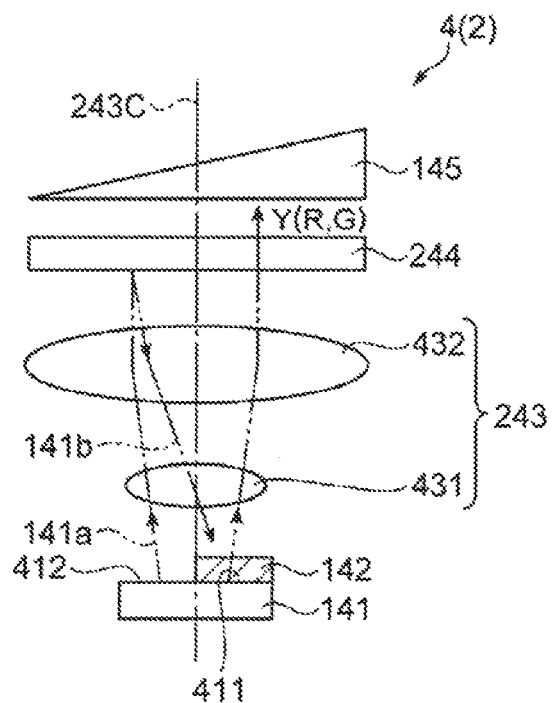
FIGS. 11A and 11B are diagrammatic views for describing a first light source apparatus in the second embodiment.
Figure 11B:
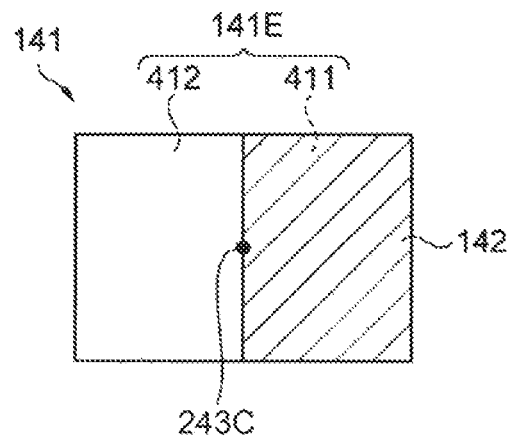

FIGS. 11A and 11B are diagrammatic views for describing the first light source apparatus 4. FIG. 11A shows the configuration of the first light source apparatus 4, and FIG. 11B is a plan view of the light source 141 in the first light source apparatus 4 viewed from the light emitting side.

The light collection system 243 is disposed on the optical path between the light source 141 and the wavelength selection element 244, as shown in FIG. 11A.

The light source 141 outputs excitation light of a first wavelength band. In the present embodiment, the light source 141 is a light emitting diode that emits light of a wavelength band containing blue light as the first wavelength band. The excitation light of the first wavelength band is not limited to blue light and may be light of a wavelength band containing violet or ultraviolet light.

The light source 141 has a rectangular light emitting region 141E, as shown in FIG. 11B. The light emitting region 141E has a first light emitting region 411 and a second light emitting region 412. The first light emitting region 411 is provided in a portion of one side of the light emitting region 141E. The area of the portion where the first light emitting region 411 is provided is substantially one-half of the area of the light emitting region 141E, and the second light emitting region 412 is provided in the rest of the light emitting region 141E. In the present specification, excitation light outputted from the first light emitting region 411 is called first excitation light, and excitation light outputted from the second light emitting region 412 is called second excitation light for convenience.

The light source 141 and the light collection system 243 are so disposed that an optical axis 243C of the light collection system 243 is positioned substantially at the center of the light emitting region 141E. Further, the phosphor layer 142 is so provided that it coincides with the first light emitting region 411 in a plan view. Specifically, the phosphor layer 142 is provided on the light emitting region on one side of a straight line passing through the optical axis 243C and extending upward and downward in FIG. 11B. In other words, in the light emitting region 141E, the region where the phosphor layer 142 is provided is the first light emitting region 411, and the region where no phosphor layer 142 is provided is the second light emitting region 412.

Each of the first light emitting region 411 and the second light emitting region 412 has a rectangular shape, and they have substantially the same area. The first light emitting region 411 and the second light emitting region 412 are preferably symmetrical with respect to the optical axis 243C. The reason for this will be described later with reference to FIG. 12.

The shape of each of the lenses provided in the first lens array 3211 and the second lens array 3212 is similar to the shape of the image formation region of each of the liquid crystal light valves 361. The orientation of the longer (shorter) sides of the rectangular first light emitting region 411 (phosphor layer 142) is so set that the rectangular shape corresponds to one-half the shape of each of the lenses.

The phosphor layer 142 is made, for example, of a material containing a cerium-activated YAG (yttrium aluminum garnet) phosphor (YAG:Ce3+) and applied onto the light exiting side of the light source 141.

The phosphor layer 142 emits Y light containing R light and G light when excited by the excitation light from the light source 141. The Y light corresponds to light of a second wavelength band different from the first wavelength band.

The light collection system 243 is formed of lenses 431 and 432 as shown in FIG. 11A and substantially parallelizes and transmits the light emitted from the phosphor layer 142 provided in the first light emitting region 411 and the second excitation light outputted from the second light emitting region 412.

The wavelength selection element 244 transmits light of the second wavelength band and reflects light of the first wavelength band. That is, the wavelength selection element 244, which is disposed on the light exiting side of the light collection system 243, transmits the Y light emitted from the phosphor layer 142 and reflects the second excitation light 141a outputted from the second light emitting region 412.

The Y light having passed through the wavelength selection element 244 is incident on the correction section 145. At least part of the second excitation light 141b outputted from the second light emitting region 412 and reflected off the wavelength selection element 244 is incident on the phosphor layer 142 via the light collection system 243. That is, the light collection system 243 has a function of guiding the second excitation light in such a manner that at least part of the second excitation light 141b which was outputted from the second light emitting region 412 of the light source 141 and reflected off the wavelength selection element 244 enters the phosphor layer 142.

Figure 12:
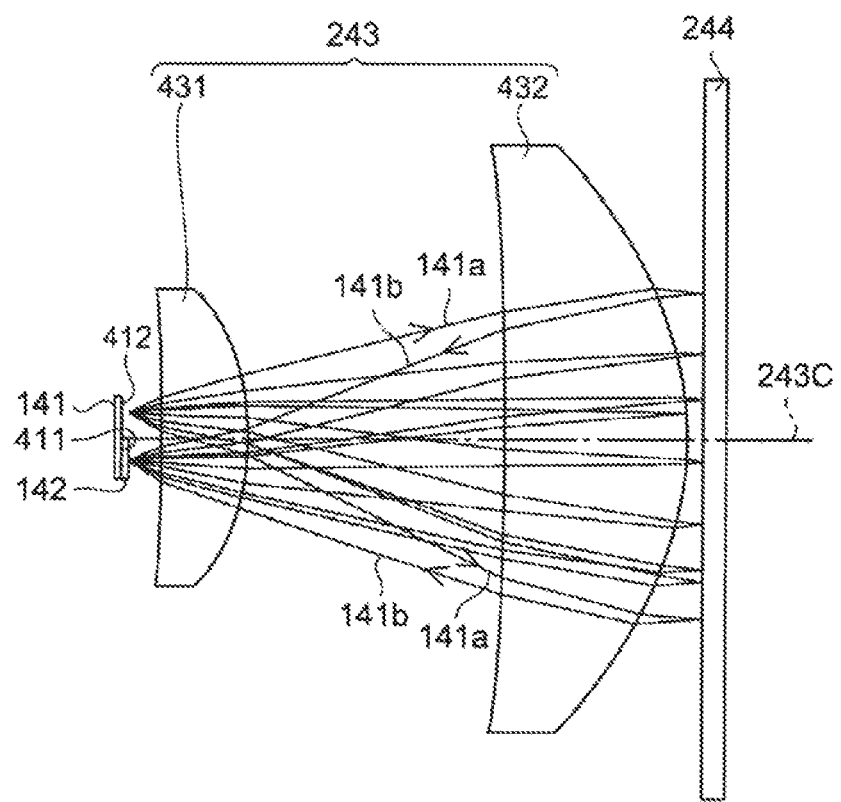
FIG. 12 is a diagrammatic view for describing the path along which second excitation light outputted from a second light emitting region travels.

FIG. 12 is a diagrammatic view for describing the path along which the second excitation light 141a outputted from the second light emitting region 412 travels.

The second excitation light 141a outputted from the second light emitting region 412 travels toward the light collection system 243 while spreading, and is substantially parallelized by the lenses 431 and 432, as shown in FIG. 12. The resultant light impinges on the wavelength selection element 244. The second excitation light 141a is then reflected off the wavelength selection element 244. At least part of the second excitation light 141b reflected off the wavelength selection element 244 is redirected by the lenses 432 and 431, and the redirected second excitation light 141b is incident on a region that is symmetrical to the second light emitting region 412 with respect to the optical axis 243C. The first light emitting region 411, on which the phosphor layer 142 is provided, is therefore preferably symmetrical to the second light emitting region 412 with respect to the optical axis 243C.

As described above, the second excitation light outputted from the second light emitting region 412 of the light source 141 is incident on the phosphor layer 142 provided in a region symmetrical to the second light emitting region 412 with respect to the optical axis 243C. The phosphor layer 142, when the second excitation light is incident thereon, emits Y light.

That is, the phosphor layer 142 emits Y light when excited by both: the first excitation light outputted from the first light emitting region 411 and incident thereon from the side facing the light source 141; and the second excitation light outputted from the second light emitting region 412 and incident thereon from the side facing away from the light source 141 via the light collection system 243 and the wavelength selection element 244. The Y light then passes through the wavelength selection element 244.

Since the phosphor layer 142 is disposed on one side of the optical axis 243C, the light having exited out of the wavelength selection element 244 travels in a direction inclined with respect to the optical axis 243C.

The correction section 145 has a function of correcting the inclination of the direction in which the light having exited out of the wavelength selection element 244 travels (inclination of optical axis of light).

Figure 13A:
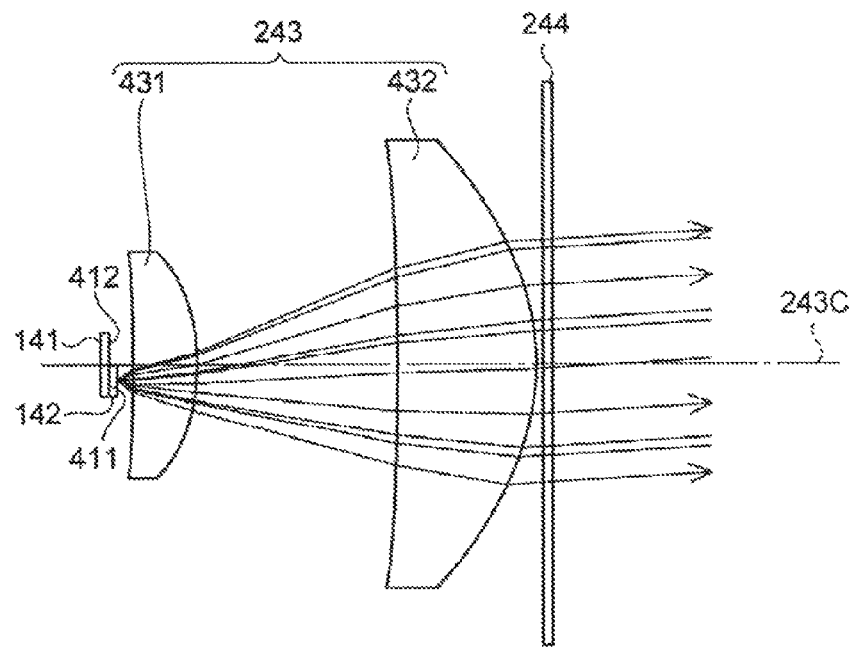
FIGS. 13A and 13B are diagrammatic views for describing the function of a correction section in the second embodiment.
Figure 13B:
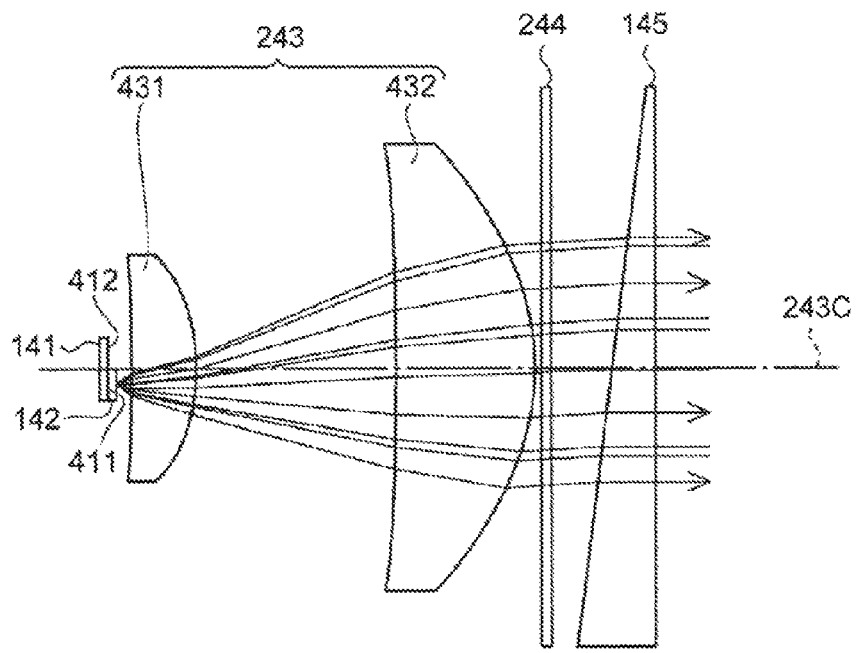

FIGS. 13A and 13B are diagrammatic views for describing the function of the correction section 145. FIG. 13A shows a case where no correction section 145 is disposed, and FIG. 13B shows a case where the correction section 145 is disposed.

When no correction section 145 is disposed, the light having been outputted from the phosphor layer 142 and having passed through the light collection system 243 and the wavelength selection element 244 travels toward the opposite side of the optical axis 243C to the side where the phosphor layer 142 is provided, as shown in FIG. 13A.

The correction section 145 has a wedge-like shape so configured that a portion thereof facing the phosphor layer 142 is thicker than a portion thereof facing the second light emitting region 412 and is disposed on the light exiting side of the wavelength selection element 244, as shown in FIG. 13B.

When the correction section 145 is disposed, the light having been outputted from the phosphor layer 142 and having passed through the light collection system 243 and the wavelength selection element 244 undergoes traveling direction correction in the correction section 145 and travels substantially in parallel to the optical axis 243C.

As described above, the phosphor layer 142 is disposed in substantially one-half the light emitting region 141E of the light source 141 on one side of the optical axis 243C in a plan view, and both sides of the phosphor layer 142 (side facing the light source 141 and side facing away from the light source 141) are irradiated with the excitation light. The correction section 145 then corrects the traveling direction of the light having been emitted from the phosphor layer 142, having passed through the wavelength selection element 244, and having traveled in a direction inclined with respect to the optical axis 243C, and the thus corrected light exits out of the first light source apparatus 4.

The light having exited out of the first light source apparatus 4 is divided by the dichroic mirrors 331 and 332 into G light and R light, which are modulated by the liquid crystal light valves 361G and 361R, respectively, as described above. The modulated G light and R light are then combined with the B light having exited out of the second light source apparatus 5 and having been modulated by the liquid crystal light valve 361B, and the combined light is projected through the projection lens 37.

As described above, the present embodiment can provide the following advantageous effects.

1. Both sides of the phosphor layer 142 (side facing light source 141 and side facing away from light source 141) can be irradiated with the excitation light outputted from the light source 141 without any complication of the structure of the first light source apparatus 4. Further, increase in the number of parts can be suppressed.

As compared with a configuration in which the phosphor layer 142 is provided over the entire light emitting region of the light source 141 (first light emitting region 411 and second light emitting region 412), light can be emitted from a small area, whereby the amount of light flux per unit area in the first light source apparatus 4 can be increased.

Therefore, not only can a simple configuration and a compact apparatus be achieved, but also the first light source apparatus 4 can be so provided that it efficiently uses excitation light to output Y light of high luminance. Further, the projector 1 that employs the first light source apparatus 4 can be compact and project a bright image.

2. Since the phosphor layer 142 is provided in a portion of one side of the light emitting region of the light source 141, the configuration that efficiently guides the second excitation light, which was outputted from the second light emitting region 412, to the phosphor layer 142, that is, the configuration of the light collection system 243, can be simplified. Further, since the phosphor layer 142 has a simple structure in which the phosphor layer is layered on a portion of one side of the light emitting region, the phosphor layer 142 can be readily provided in a desired position, and the first light source apparatus 4 can be further readily manufactured.

3. Since the phosphor layer 142 is provided in the first light emitting region 411, which is symmetrical to the second light emitting region 412 with respect to the optical axis 243C, the phosphor layer 142 can be irradiated with the second excitation light outputted from the second light emitting region 412 from the side facing away from the light source with no loss. The first light source apparatus 4 can therefore output Y light of higher luminance.

4. Since the first light source apparatus 4 includes the correction section 145, inclination of the optical axis of the light, which exits out of the first light source apparatus 4, with respect to the optical axis 243C can be corrected. As a result, the first light source apparatus 4 can irradiate the liquid crystal light valves 361R and 361G, which are targets to be illuminated, with the R and G light with the amount of loss thereof suppressed.

Further, the correction section 145, which has a simple wedge-like shape, can be readily manufactured.

5. Since each of the first light emitting region 411 and the second light emitting region 412 has a rectangular shape when viewed in the direction along the optical axis 243C, the rectangular image formation region of each of the liquid crystal light valves 361 to be illuminated can be efficiently illuminated.

6. Since the first light source apparatus 4 outputs Y light containing R light and G light from the single light source 141, the size of the first light source apparatus 4 and hence the size of the projector 1 can be reduced as compared with a configuration in which two separate light sources 141 are provided in correspondence with the R light and the G light.

7. Since the light source 141 includes a light emitting diode, which is compact and emits light efficiently, and uses light emitted from the light emitting diode as excitation light, the size of the first light source apparatus 4 can be further reduced, and the efficiency at which the excitation light, which causes the phosphor layer 142 to emit light, is used can be increased.

Third Embodiment

A projector according to a third embodiment will be described below with reference to the drawings. In the following description, the same configurations and members as those in the projector 1 according to the second embodiment have the same reference characters, and detailed descriptions thereof are omitted or simplified.

Figure 14:
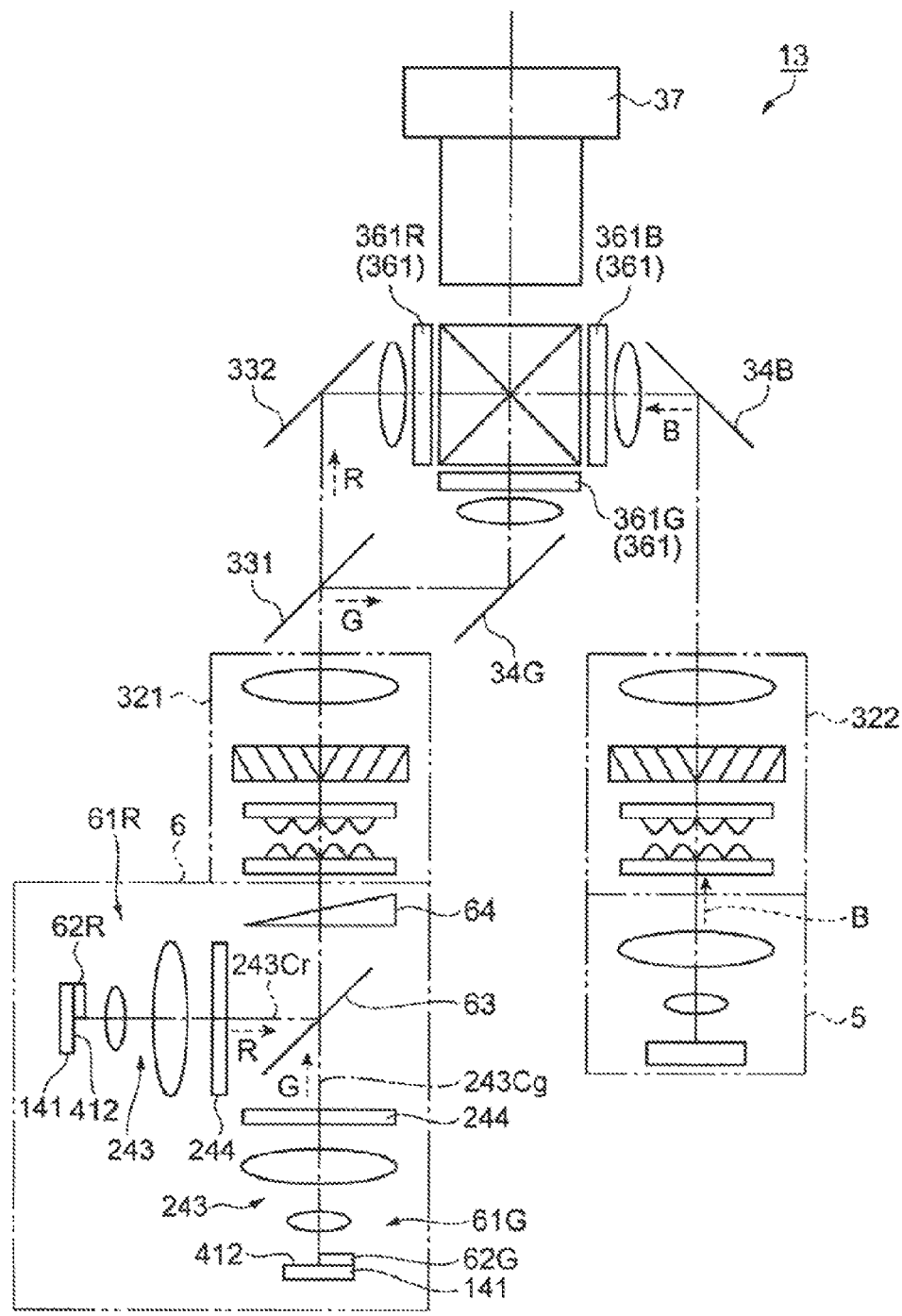
FIG. 14 is a diagrammatic view showing an optical unit in a projector according to a third embodiment.

FIG. 14 is a diagrammatic view showing an optical unit 13 in the projector according to the present embodiment.

The projector according to the present embodiment includes a first light source apparatus 6 having a configuration different from that of the first light source apparatus 4 in the projector 1 according to the second embodiment, as shown in FIG. 14.

In contrast to the configuration according to the second embodiment in which the first light source apparatus 4 includes the single light source 141, the first light source apparatus 6 according to the present embodiment includes a light source 141 for R light and a light source 141 for G light. Each of the light sources 141 outputs excitation light of a first wavelength band.

The first light source apparatus 6 according to the present embodiment includes an R-related light source section 61R, which has the light source 141 for R light, a G-related light source section 61G, which has the light source 141 for G light, a dichroic mirror 63, and a correction section 64.

The R-related light source section 61R includes a phosphor layer 62R, the light collection system 243, and the wavelength selection element 244 as well as the light source 141 for R light.

The phosphor layer 62R emits R light when excited with the excitation light from the light source 141. The R light corresponds to light of a second wavelength band.

The phosphor layer 62R is provided in substantially one-half the light emitting region of the light source 141 as shown in FIG. 14, as in the case of the phosphor layer 142 in the second embodiment. Specifically, the phosphor layer 62R is made of a red phosphor (for example, material containing $CaAlSiN_3$—$Si_2N_2O$:Eu). The phosphor layer 62R is applied onto a portion of the light emitting region of the light source 141 on one side of an optical axis 243Cr of the light collection system 243 in the R-related light source section 61R.

As described in the second embodiment, the excitation light outputted from the light source 141 is guided by the light collection system 243 and the wavelength selection element 244 to both sides of the phosphor layer 62R, and then converted into R light. The R light passes through the wavelength selection element 244 toward the dichroic mirror 63.

The G-related light source section 61G includes a phosphor layer 62G, the light collection system 243, and the wavelength selection element 244 as well as the light source 141 for G light.

The phosphor layer 62G emits G light when excited with the excitation light from the light source 141. The G light corresponds to light of the second wavelength band.

The phosphor layer 62G is provided in substantially one-half the light emitting region of the light source 141 as shown in FIG. 14, as in the case of the phosphor layer 62R in the R-related light source section 61R. Specifically, the phosphor layer 62G is made of a green phosphor (for example, material containing $Ba_3Si_6O_{12}N_2$:Eu). The phosphor layer 62G is applied onto a portion of the light emitting region of the light source 141 on one side of an optical axis 243Cg of the light collection system 243 in the G-related light source section 61G.

As described in the second embodiment, the excitation light outputted from the light source 141 is guided by the light collection system 243 and the wavelength selection element 244 to both sides of the phosphor layer 62G, and then converted into G light. The G light passes through the wavelength selection element 244 toward the dichroic mirror 63.

The R-related light source section 61R and the G-related light source section 61G are so disposed that the optical axis 243Cr and the optical axis 243Cg thereof are substantially perpendicular to each other, as shown in FIG. 14. In the viewing direction in FIG. 14, the phosphor layer 62R is provided on the upper side of the optical axis 243Cr, and the phosphor layer 62G is provided on the right side of the optical axis 243Cg.

The dichroic mirror 63 is disposed in a position where the optical axis 243Cr and the optical axis 243Cg intersect each other. The dichroic mirror 63 is so disposed that it is inclined with respect to the optical axes 243Cr and 243Cg by about 45° so that it reflects the R light toward the first optical integration illumination system 321 and transmits the G light toward the first optical integration illumination system 321.

The dichroic mirror 63 combines the R light having exited out of the R-related light source section 61R and the G light having exited out of the G-related light source section 61G with each other and outputs the combined light to the correction section 64.

The correction section 64 has a wedge-like cross-sectional shape as in the case of the correction section 145 in the second embodiment and is disposed on the optical axis 243Cg on the light exiting side of the dichroic mirror 63, as shown in FIG. 14. The correction section 64 is further so disposed that a thicker portion thereof faces the phosphor layer 62G. On the other hand, with respect to the phosphor layer 62R, the correction section 64 is so disposed that the thicker portion thereof faces the phosphor layer 62R via the dichroic mirror 63, which reflects R light.

The traveling directions of the R light and the G light having exited out of the dichroic mirror 63 are corrected by the correction section 64, and the R light and G light traveling in the corrected directions are incident on the first lens array 3211 provided in the first optical integration illumination system 321 substantially at right angles, as described in the second embodiment.

Light having exited out of the first optical integration illumination system 321 is divided into G light and R light, which are incident on the liquid crystal light valves 361G and 361R, respectively, as described in the second embodiment.

As described above, the projector according to the present embodiment can provide the following advantageous effect in addition to the advantageous effects provided by the second embodiment.

Since the first light source apparatus 6 includes the R-related light source section 61R, which outputs R light, and the G-related light source section 61G, which outputs G light, the luminance of the R light and the luminance of the G light can be controlled independently of each other. As a result, the white balance of an image can be readily adjusted.

Fourth Embodiment

A projector according to a fourth embodiment will be described below with reference to the drawings. In the following description, the same configurations and members as those in the projectors according to the second and third embodiments have the same reference characters, and detailed descriptions thereof are omitted or simplified.

Figure 15:
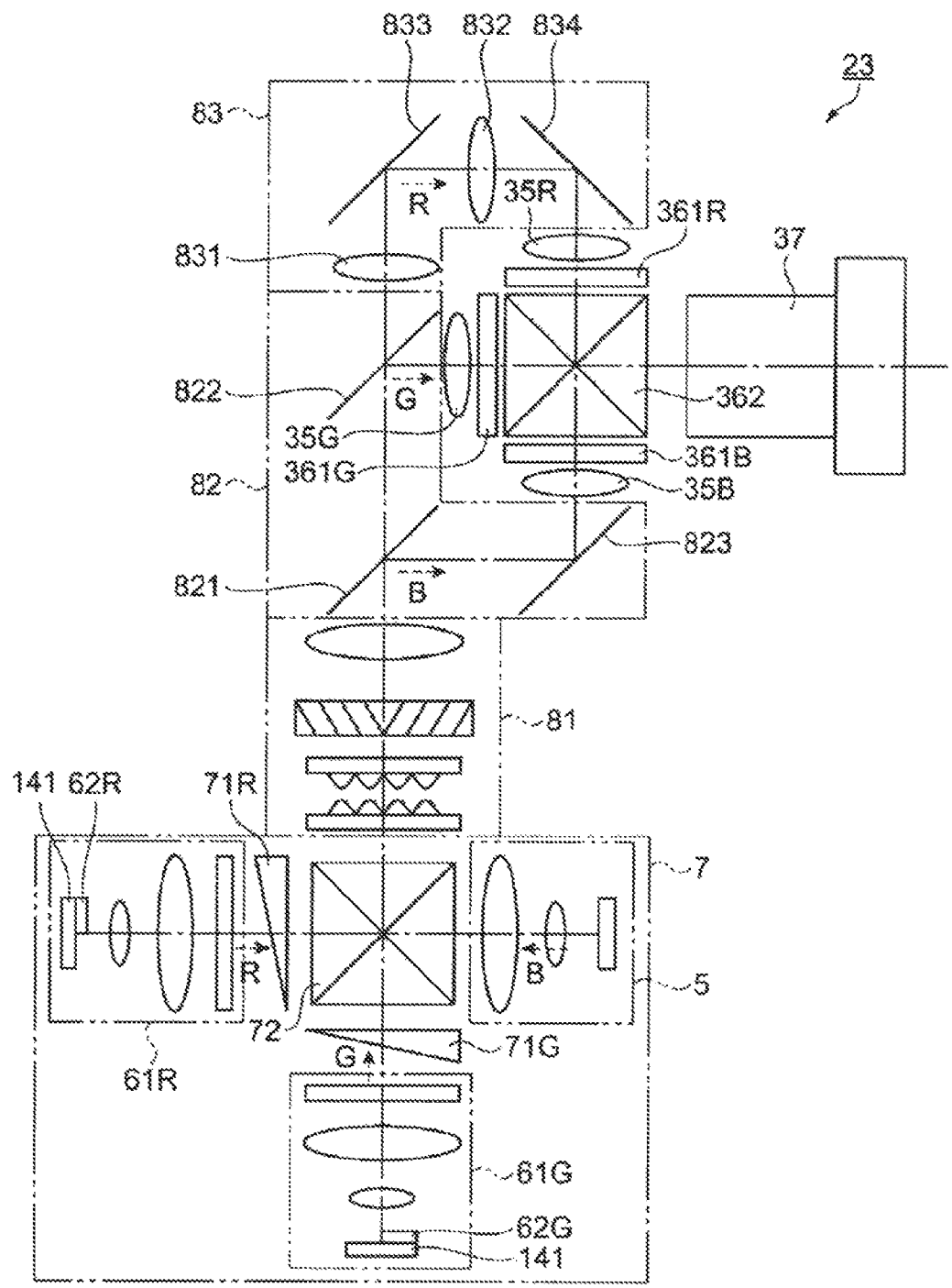
FIG. 15 is a diagrammatic view showing an optical unit in a projector according to a fourth embodiment.

FIG. 15 is a diagrammatic view showing an optical unit 23 in the projector according to the present embodiment.

The projector according to the second embodiment includes the first light source apparatus 4, which outputs Y light, and the projector according to the third embodiment includes the first light source apparatus 6, which outputs R light and G light, whereas the projector according to the present embodiment includes a light source apparatus 7, which outputs R light, G light, and B light, as shown in FIG. 15.

The projector according to the present embodiment further includes an optical integration illumination system 81, which differs from the optical integration illumination systems in the second and third embodiments, a color separation system 82, and a relay system 83.

The light source apparatus 7 includes the R-related light source section 61R and the G-related light source section 61G in the third embodiment, the second light source apparatus 5 in the second embodiment, correction sections 71R and 71G, a cross dichroic prism 72.

The correction section 71R is disposed on the light exiting side of the R-related light source section 61R, corrects the inclination of the optical axis of the R light having exited out of the R-related light source section 61R, and outputs the R light traveling in the corrected direction toward the cross dichroic prism 72. The correction section 71G is disposed on the light exiting side of the G-related light source section 61G, corrects the inclination of the optical axis of the G light having exited out of the G-related light source section 61G, and outputs the G light traveling in the corrected direction toward the cross dichroic prism 72.

The second light source apparatus 5 is so disposed that it faces the R-related light source section 61R with the cross dichroic prism 72 therebetween and outputs B light toward the cross dichroic prism 72.

The cross dichroic prism 72 is formed by bonding four rectangular prisms and hence has a substantially square shape in a plan view, and two dielectric multilayer films are formed on the interfaces between the bonded rectangular prisms. In the cross dichroic prism 72, the dielectric multilayer films reflect the R light having exited out of the R-related light source section 61R and the B light having exited out of the second light source apparatus 5 and transmit the G light having exited out of the G-related light source section 61G to combine the R light, the G light, and the B light with one another, and the combined light exits out of the cross dichroic prism 72 toward the optical integration illumination system 81.

The optical integration illumination system 81 includes the first optical integration illumination system 321 in the second embodiment. The optical integration illumination system 81 converts the light incident thereon in such a way that light with which the surface of each of the liquid crystal light valves 361 is illuminated has a uniform in-plane light intensity distribution.

The color separation system 82 includes dichroic mirrors 821 and 822 and a reflection mirror 823 and divides light having exited out of the optical integration illumination system 81 into three color light fluxes, B light, R light, and G light. Specifically, the dichroic mirror 821, which receives the light having exited out of the optical integration illumination system 81, reflects the B light and transmits the G light and the R light. The dichroic mirror 822, which receives the G light and the R light having passed through the dichroic mirror 821, reflects the G light and transmits the R light.

The B light reflected off the dichroic mirror 821 is reflected off the reflection mirror 823, passes through the field lens 35B, and enters the liquid crystal light valve 361B. The G light reflected off the dichroic mirror 822 passes through the field lens 35G and enters the liquid crystal light valve 361G.

The relay system 83 includes a light-incident-side lens 831, a relay lens 832, and reflection mirrors 833 and 834 and guides the R light separated by the color separation system 82 to the field lens 35R. The R light incident on the field lens 35R enters the liquid crystal light valve 361R. The color separation system 82 and the relay system 83 are so configured that the relay system 83 guides the R light but are not necessarily configured this way. For example, the color separation system 82 and the relay system 83 may instead be so configured that the relay system 83 guides the B light.

The color light fluxes having entered the liquid crystal light valves 361B, 361G, and 361R are modulated in accordance with image information, then combined with one another in the cross dichroic prism 362, and projected through the projection lens 37, as described in the second embodiment.

As described above, the projector according to the present embodiment can provide the following advantageous effect in addition to the advantageous effects provided by the second and third embodiments.

In the second and third embodiments, the first optical integration illumination system 321 and the second optical integration illumination system 322 are required, whereas in the present embodiment, the second optical integration illumination system 322 is not required, whereby the size of the optical unit 23 and hence the size of the projector can be reduced.

The second to fourth embodiments may be changed as follows.

Sixth Variation

In the embodiments described above, the phosphor layer 142 is applied onto the light source 141, which is a unitary component. The light source may instead be formed of two separate light emitting devices, and a phosphor layer may be applied onto one of the two light emitting devices, as shown, for example, in FIGS. 16A and 16B.

Figure 16A:
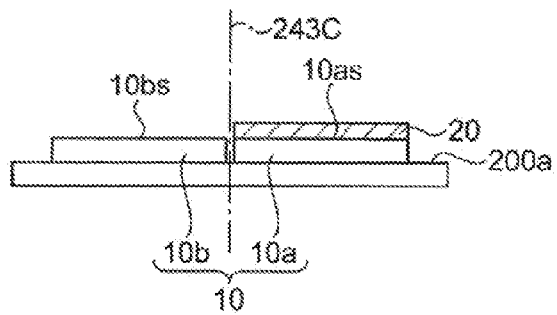
FIGS. 16A and 16B are diagrammatic views showing a light source and a phosphor layer in a sixth variation.
Figure 16B:
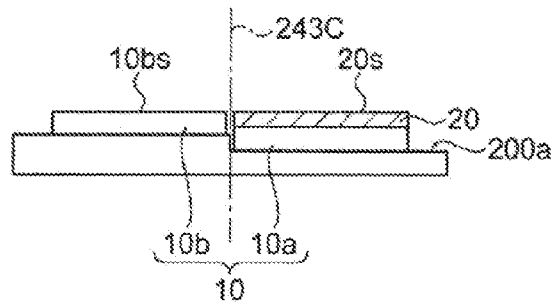

FIGS. 16A and 16B are diagrammatic views showing a light source 10 and a phosphor layer 20 in a sixth variation. FIGS. 16A and 16B differ from each other in terms of the arrangement of a plurality of light emitting devices.

The light source 10 includes two light emitting devices 10a and 10b, which are disposed on a substrate 200, as shown in FIGS. 16A and 16B. The substrate 200 has a reference surface 200a, which is perpendicular to the optical axis 243C.

The area of the light emitting region of the light emitting devices 10a is the same as that of the light emitting devices 10b, and the shape of the light emitting region of the light emitting devices 10a is identical to the shape of the light emitting region of the light emitting devices 10b. The phosphor layer 20 is applied onto the light emitting region of the light emitting device 10a.

The light emitting devices 10a and 10b are disposed on opposite sides of the optical axis 243C, and the phosphor layer 20 is provided in a portion of the light source 10 on one side.

In the light source 10 shown in FIG. 16A, the height of a light emitting surface 10as of the light emitting device 10a measured from the reference surface 200a is equal to the height of a light emitting surface 10bs of the light emitting device 10b measured from the reference surface 200a. On the other hand, in the light source 10 shown in FIG. 16B, the height of the light emitting surface 10bs of the light emitting device 10b measured from the reference surface 200a is equal to the height of a light incident surface 20s of the phosphor layer 20 measured from the reference surface 200a.

The arrangement of the light emitting devices 10a and 10b as shown in FIG. 16B allows the phosphor layer 20 to be irradiated more efficiently with the second excitation light outputted from the light emitting device 10b and guided through the light collection system 243 and the wavelength selection element 244 to the phosphor layer 20. Further, the light source 10 is not necessarily formed of two light emitting devices but may instead be formed of three or more light emitting devices.

Seventh Variation

In the embodiments described above, the phosphor layer 142 is applied onto the light source 141, but the phosphor layer 142 may instead be provided on a transparent member separate from the light source 141.

Figure 17:
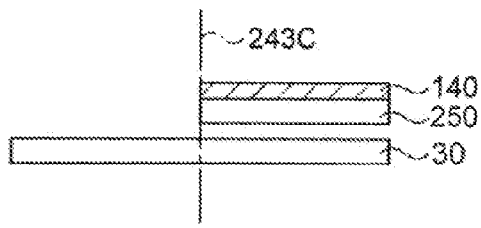
FIG. 17 is a diagrammatic view showing a light source and a phosphor layer in a seventh variation.

FIG. 17 is a diagrammatic view showing a light source 30 and a phosphor layer 140 in a seventh variation.

The phosphor layer 140 is applied onto a plate-shaped transparent member 250 having an area about one-half the area of the light emitting region of the light source (light emitting device) 30 and disposed on one side of the optical axis 243C, that is, on a portion of one side of the light emitting region of the light source 30.

Eighth Variation

In the embodiments described above, the correction sections 145, 64, 71R, and 71G, each of which has a wedge-like cross-sectional shape, are used as the correction section, but the correction section is not necessarily configured this way. For example, the first lens array 3211 may be configured to provide the function of the correction section.

Figure 18A:
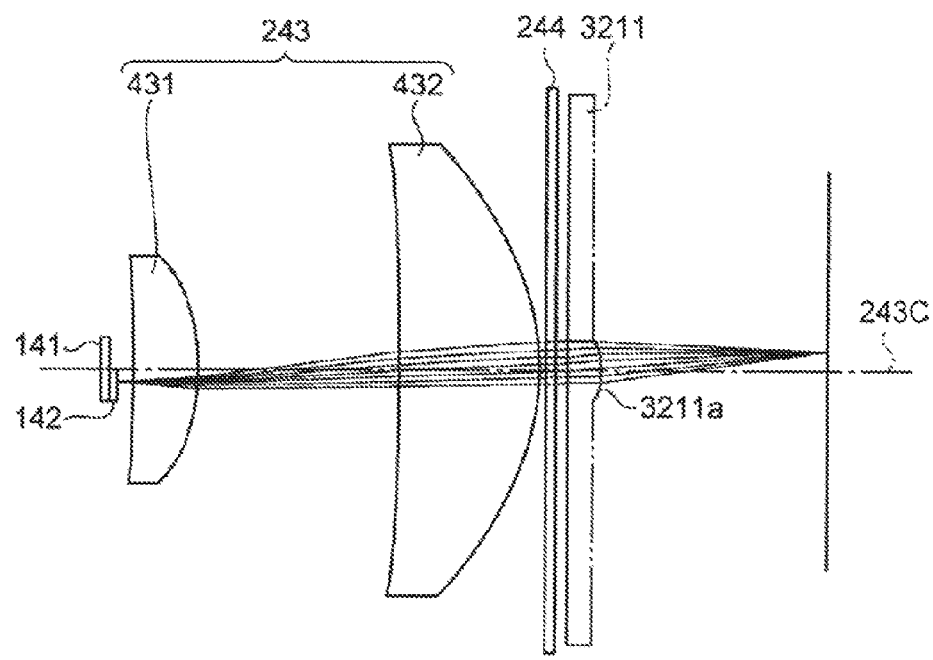
FIGS. 18A and 18B are diagrammatic views for describing a correction section in an eighth variation.
Figure 18B:
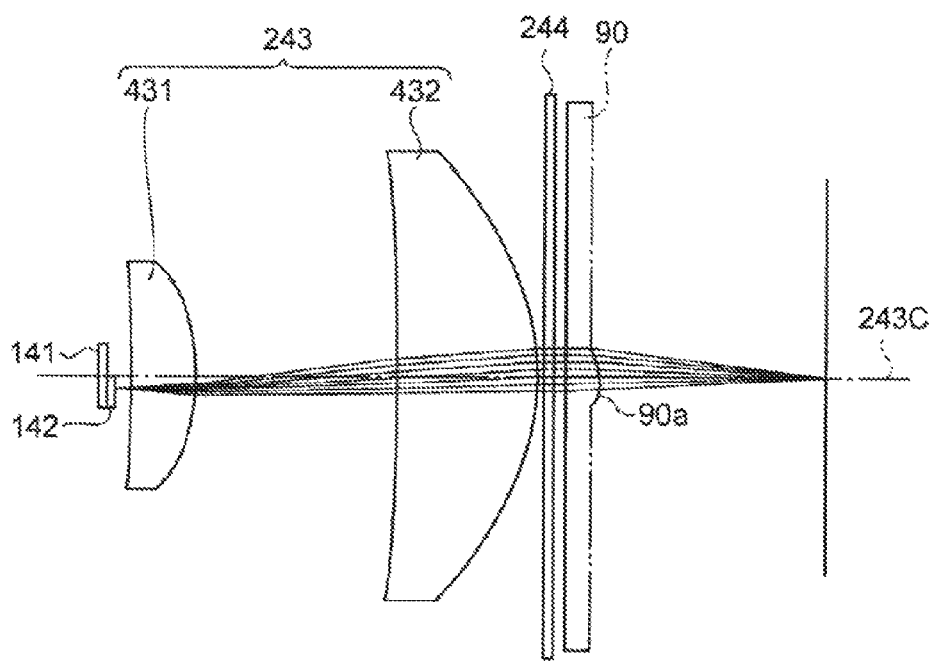

FIGS. 18A and 18B are diagrammatic views for describing a correction section in an eighth variation. FIG. 18A shows the first lens array 3211 that does not provide the function of the correction section, and FIG. 18B shows a first lens array 90 that provides the function of the correction section.

The first lens array 3211 has a plurality of first lenses 3211a, and the first lens array 90 has a plurality of first lenses 90a. To clearly describe the first lenses, FIG. 18A shows only one of the first lenses 3211a, and FIG. 18B shows only one of the first lenses 90a.

The optical axis of each of the first lenses 90a in the first lens array 90 is shifted from the optical axis of the corresponding first lens 3211a in the first lens array 3211 downward, that is, from the optical axis 243C toward the side where the phosphor layer 142 is formed. Further, although not shown, the optical axis of each of the first lenses 90a is also shifted from the optical axis of the second lens in the second lens array 3212 that corresponds to the first lens 90a.

As shown in FIG. 18A, when the first lens array 3211 that does not provide the function of the correction section is used, light having been outputted from the phosphor layer 142 and having passed through the light collection system 243, the wavelength selection element 244, and the first lens array 3211 travels toward the opposite side of the optical axis 243C to the side where the phosphor layer 142 is provided.

On the other hand, as shown in FIG. 18B, when the first lens array 90 that provides the function of the correction section is used, the light having been outputted from the phosphor layer 142 and having passed through the light collection system 243, the wavelength selection element 244, and the first lens array 90 has a corrected optical axis.

As described above, when each of the first lenses 90a in the first lens array 90 has the function of the correction section and hence the first lens array 90 is virtually provided with the correction section, the inclination of the optical axis of the light having exited out of the wavelength selection element 244 can be corrected without any increase in the number of parts.

Ninth Variation

The projector according to each of the embodiments described above uses a liquid crystal panel as the light modulator, but the light modulator may instead be a micromirror-type light modulator, for example, a digital mirror device.

Figure 19:
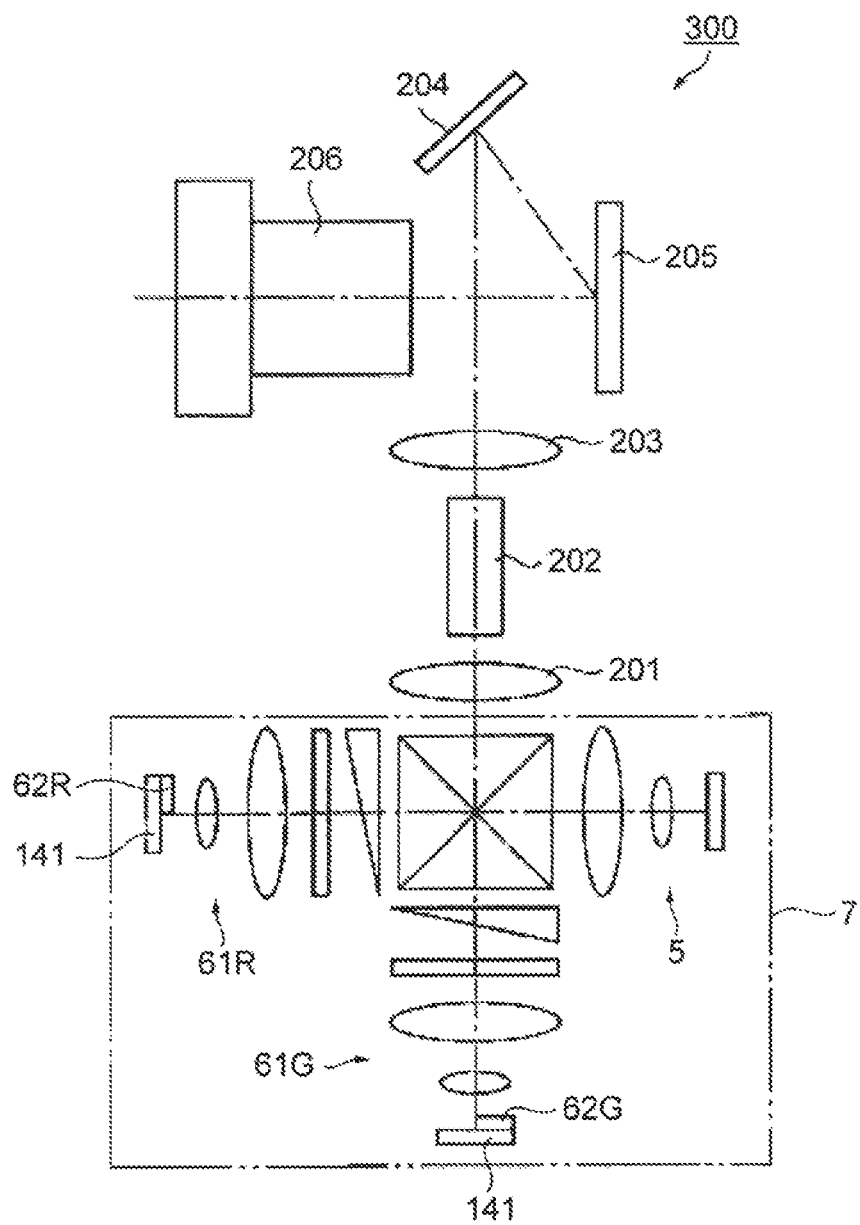
FIG. 19 is a diagrammatic view showing an optical unit in a projector according to a ninth variation.

FIG. 19 is a diagrammatic view showing an optical unit 300 in a projector according to a ninth variation.

The optical unit 300 includes the light source apparatus 7 in the fourth embodiment, a superimposing lens 201, a rod integrator 202, a light collection system 203, a reflection mirror 204, a micromirror device 205 as the light modulator, and a projection lens 206.

The light source apparatus 7 outputs R light, G light, and B light by time sharing in accordance with image information.

Each of the light fluxes outputted from the light source apparatus 7 is guided by the superimposing lens 201 to the light incident surface of the rod integrator 202 and is reflected off the inner surface of the rod integrator 202 multiple times so that the light flux is uniformized. The resultant light flux exits through the light exiting surface of the rod integrator 202.

The light having exited out of the rod integrator 202 is substantially parallelized by the light collection system 203 and reflected off the reflection mirror 204 toward the micromirror device 205.

The light incident on the micromirror device 205 is reflected off a micromirror corresponding to each pixel in accordance with the image information so that the light is modulated into light carrying an image, which is projected through the projection lens 206.

As described above, the light source apparatus 7 having the phosphor layers 62R and 62G provided on part of the light emitting regions of the light sources 141 can be used as a light source apparatus in a projector including a micromirror-type light modulator and provides the same advantageous effects as those described in the above embodiments.

The ninth variation has been described with reference to the light source apparatus 7 in the fourth embodiment. Instead, the light source apparatus 2 in the second embodiment and the light source apparatus in the third embodiment (first light source apparatus 6 and second light source apparatus 5) can be used in a projector including a micromirror-type light modulator.

Tenth Variation

The projector 1 according to one of the embodiments described above uses a transmissive liquid crystal panel as the light modulator but may instead uses a reflective liquid crystal panel.

Eleventh Variation

In the embodiments described above, a light emitting diode is used as the light source 141, but the light source 141 is not limited to a light emitting diode and may, for example, be a semiconductor laser, an organic EL (electro luminescence) device, or a UV lamp.

Twelfth Variation

The light source 141 in the embodiments described above has a rectangular light emitting region, but the shape of the light emitting region is not limited to a rectangle. For example, the light emitting region may have a circular shape, an elliptical shape, or any other shape.

Thirteenth Variation

The phosphor layer 142 in one of the embodiments described above is formed on the first light emitting region 411, which is symmetrical to the second light emitting region 412 with respect to the optical axis 243C, but no symmetry is essentially required. The phosphor layer 142 only needs to be so provided that it contains a region symmetrical to the second light emitting region 412 with respect to the optical axis 243C. That is, the phosphor layer 142 only needs to be provided on the optical path of the second excitation light outputted from the second light emitting region 412 and reflected off the wavelength selection element 244.

Further, the first light emitting region 411 and the second light emitting region 412 may instead be so formed that the shapes thereof in a plan view perpendicular to the optical axis 243C are similar to each other.

According to the configuration described above, even when the distance between the second light emitting region 412 and the light collection system 243 and the distance between the light collection system 243 and the phosphor layer 142 differ from each other, the second excitation light outputted from the second light emitting region 412 can be efficiently guided to the phosphor layer 142. Therefore, the phosphor layer 142 can be efficiently irradiated with the second excitation light outputted from the second light emitting region 412 with an increase in the degree of freedom in arranging the light source 141 and the phosphor layer 142 with respect to the light collection system 243.

In each of the first to fourth embodiments, the light source apparatus according to the embodiment of the invention is incorporated in a projector by way of example, but the light source apparatus is not necessarily incorporated in a projector. The light source apparatus according to each of the embodiments of the invention can be used in a lighting apparatus, a headlamp of an automobile, and other apparatus.

The entire disclosure of Japanese Patent Application No.: 2013-152320, filed on Jul. 23, 2013, 2013-263727, filed on Dec. 20, 2013 and 2014-089596, filed on Apr. 23, 2014 are expressly incorporated by reference herein.

What is claimed is:

1. A light source apparatus comprising:
a light emitting device that has a first light emitting region and a second light emitting region and outputs excitation light of a first wavelength band;
a phosphor layer that coincides with the first light emitting region in a plan view and emits light of a second wavelength band different from the first wavelength band when irradiated with first excitation light outputted from the first light emitting region;
a reflection element that is provided on the opposite side of the phosphor layer to the light emitting device, transmits light of the second wavelength band, and reflects light of the first wavelength band; and
a light guide section that is disposed on an optical path between the phosphor layer and the reflection element, transmits second excitation light outputted from the second light emitting region and light outputted from the phosphor layer, and guides the second excitation light reflected off the reflection element such that at least part of the reflected second excitation light is incident on the phosphor layer.

2. The light source apparatus according to claim 1, wherein the reflection element includes an inclined portion so as to reflect at least part of the second excitation light in such a manner that the at least part of the second excitation light enter the phosphor layer, the inclined portion being inclined with respect to a plane perpendicular to a principal ray of the light emitted from the phosphor layer, and the second excitation light being outputted from the second light emitting region.

3. The light source apparatus according to claim 2, wherein the inclined portion has a curved surface concave toward the phosphor layer.

4. The light source apparatus according to claim 2, wherein the phosphor layer is in thermally contact with the light emitting device.

5. A projector comprising:
the light source apparatus according to claim 2;
a light modulator that modulates light having exited out of the light source apparatus in accordance with image information; and
a projection lens that projects modulated light from the light modulator.

6. The light source apparatus according to claim 1, wherein the light guide section is formed of a light collection system.

7. The light source apparatus according to claim 6, wherein the first light emitting region is provided in a portion of one side of the light emitting region of the light emitting device, and
the second light emitting region is provided in the rest of the light emitting region.

8. A projector comprising:
the light source apparatus according to claim 7;
a light modulator that modulates light having exited out of the light source apparatus in accordance with image information; and
a projection lens that projects modulated light from the light modulator.

9. The light source apparatus according to claim 6, wherein the phosphor layer is so provided that the phosphor layer includes a region symmetrical to the second light emitting region with respect to the optical axis of the light collection system.

10. The light source apparatus according to claim 6, further comprising:
a correction section that corrects the traveling direction of the light of the second wavelength band having passed through the reflection element.

11. The light source apparatus according to claim 10, wherein the first light emitting region is provided in a portion of one side of the light emitting region of the light emitting device, the second light emitting region is provided in the rest of the light emitting region, and the correction section has a wedge-like shape so configured that a portion thereof facing the phosphor layer is thicker than a portion thereof facing the second light emitting region.

12. The light source apparatus according to claim 10, further comprising:

a first lens array that is disposed on an optical path of the light of the second wavelength band having passed through the reflection element and has a plurality of first lenses; and a second lens array that is disposed on the light exiting side of the first lens array and has a plurality of second lenses provided in correspondence with the plurality of first lenses, wherein the first light emitting region is provided in a portion of one side of the light emitting region of the light emitting device, the second light emitting region is provided in the rest of the light emitting region, the optical axis of each of the plurality of first lenses is shifted from the optical axis of the corresponding second lens, and the first lenses serve as the correction section.

13. The light source apparatus according to claim 6, wherein the shapes of the first light emitting region and the second light emitting region in a plane perpendicular to the optical axis of the light collection system are similar to each other.

14. A projector comprising:

the light source apparatus according to claim 6;

a light modulator that modulates light having exited out of the light source apparatus in accordance with image information; and a projection lens that projects modulated light from the light modulator.

15. The light source apparatus according to claim 1, wherein the area of the phosphor layer is smaller than the area of the light emitting device.

16. The light source apparatus according to claim 1, wherein the first light emitting region and the second light emitting region are rectangular when viewed in a direction along the optical axis of the light collection system.

17. The light source apparatus according to claim 1, wherein the areas of the first light emitting region and the second light emitting region in a plane perpendicular to the optical axis of the light collection system are equal to each other.

18. The light source apparatus according to claim 1, wherein the light emitting device has a light emitting diode or a semiconductor laser that outputs the excitation light.

19. A projector comprising:

the light source apparatus according to claim 1;

a light modulator that modulates light having exited out of the light source apparatus in accordance with image information; and a projection lens that projects modulated light from the light modulator.

20. The projector according to claim 19, wherein the following expression is satisfied:

$$\Omega a \leq Sb \times \Omega b / Sa$$

where $\Omega a$ is the solid angle corresponding to the reflection element viewed from the center of the light emitting device, $Sa$ is the area of the light emitting device, $Sb$ is the area of the light modulator, and $\Omega b$ is the solid angle defined by one-half the collection angle of the projection lens.

* * * * *